United States Patent
Yang et al.

(10) Patent No.: US 12,336,360 B2
(45) Date of Patent: Jun. 17, 2025

(54) DISPLAY DEVICES INCLUDING CONVERSION LAYERS WITH QUANTUM DOTS AND LOW-REFRACTION COLOR FILTERS

(71) Applicant: Samsung Display Co., LTD., Yongin-si (KR)

(72) Inventors: Gi Hoon Yang, Yongin-si (KR); Tae Min Kim, Yongin-si (KR); Bong Sung Seo, Yongin-si (KR); Dong Geun Shin, Yongin-si (KR); Ho Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 422 days.

(21) Appl. No.: 17/212,509

(22) Filed: Mar. 25, 2021

(65) Prior Publication Data

US 2022/0077253 A1 Mar. 10, 2022

(30) Foreign Application Priority Data

Sep. 7, 2020 (KR) .................. 10-2020-0114162

(51) Int. Cl.
*H10H 29/851* (2025.01)
*H01L 25/075* (2006.01)
(Continued)

(52) U.S. Cl.
CPC ..... *H10H 29/8514* (2025.01); *H01L 25/0753* (2013.01); *H01L 25/167* (2013.01);
(Continued)

(58) Field of Classification Search
CPC .. H10H 20/835; H10H 20/84; H10H 20/8513; H10H 20/8514; H10H 20/8516; H10H 20/856; H10H 20/882; H10H 29/14; H10H 29/37; H10H 29/41; H10H 29/49; H10H 29/8325; H10H 29/8421; H10H 29/8514; H10H 29/8516; H10H 29/8517; H10H 29/854; H10H 29/8552; H10H 29/856; H10H 29/882; H01L 25/0753; H01L 25/167; H01L 2225/065; H10K 59/10–126; H10K 58/30–38; H10K 50/85–858
(Continued)

(56) References Cited

U.S. PATENT DOCUMENTS 7,129,633 B2   10/2006 Kosyachkov
10,539,849 B2   1/2020 Moriya et al.
(Continued)

FOREIGN PATENT DOCUMENTS

EP   3 624 199      3/2020
EP   3624199 A2 *  3/2020  ......... H01L 27/3206
(Continued)

*Primary Examiner* — Marcos D. Pizarro
(74) *Attorney, Agent, or Firm* — KILE PARK REED & HOUTTEMAN PLLC

(57) ABSTRACT

A display device includes a bank including an opening defining pixels, light emitting elements disposed in the pixels, a color conversion layer disposed on the light emitting elements in the opening, a capping layer overlapping the color conversion layer, and a color filter layer disposed on the capping layer. The color filter layer includes a low refractive material.

16 Claims, 15 Drawing Sheets

(51) Int. Cl.
*H01L 25/16* (2023.01)
*H10H 20/80* (2025.01)
*H10H 20/832* (2025.01)
*H10H 20/84* (2025.01)
*H10H 20/851* (2025.01)
*H10H 20/856* (2025.01)
*H10H 29/14* (2025.01)
*H10H 29/37* (2025.01)
*H10H 29/41* (2025.01)
*H10H 29/49* (2025.01)
*H10H 29/80* (2025.01)
*H10H 29/85* (2025.01)
*H10H 29/854* (2025.01)
*H10H 29/855* (2025.01)
*H10H 29/856* (2025.01)

(52) U.S. Cl.
CPC .......... *H10H 20/835* (2025.01); *H10H 20/84* (2025.01); *H10H 20/8513* (2025.01); *H10H 20/8514* (2025.01); *H10H 20/8516* (2025.01); *H10H 20/856* (2025.01); *H10H 20/882* (2025.01); *H10H 29/14* (2025.01); *H10H 29/37* (2025.01); *H10H 29/41* (2025.01); *H10H 29/49* (2025.01); *H10H 29/8325* (2025.01); *H10H 29/8421* (2025.01); *H10H 29/8516* (2025.01); *H10H 29/8517* (2025.01); *H10H 29/854* (2025.01); *H10H 29/8552* (2025.01); *H10H 29/856* (2025.01); *H10H 29/882* (2025.01); *H01L 2225/065* (2013.01)

(58) Field of Classification Search
USPC .......................................................... 257/40
See application file for complete search history.

(56) References Cited

U.S. PATENT DOCUMENTS

| | | | |
|---|---|---|---|
| 10,678,091 B2 | 6/2020 | Lee et al. | |
| 10,824,012 B2 | 11/2020 | Jung et al. | |
| 10,916,722 B2 | 2/2021 | Park et al. | |
| 11,037,914 B2 | 6/2021 | Kim | |
| 2006/0012296 A1 | 1/2006 | Eida et al. | |
| 2013/0187840 A1* | 7/2013 | Tomita | H10K 59/38 345/76 |
| 2016/0126501 A1* | 5/2016 | Kim | G03F 7/0007 430/281.1 |
| 2019/0165312 A1 | 5/2019 | Bae et al. | |
| 2019/0219875 A1* | 7/2019 | Jung | H10K 59/38 |
| 2019/0377111 A1* | 12/2019 | Taguchi | G02B 5/201 |
| 2020/0013766 A1* | 1/2020 | Kim | H01L 25/167 |
| 2020/0091464 A1* | 3/2020 | Park | H10K 50/125 |
| 2020/0219935 A1* | 7/2020 | Ahn | H10K 59/122 |
| 2022/0077121 A1* | 3/2022 | Bae | H01L 33/507 |

FOREIGN PATENT DOCUMENTS

| | | |
|---|---|---|
| JP | 2013-175433 | 9/2013 |
| JP | 6673997 | 4/2020 |
| KR | 10-2005-0051699 | 6/2005 |
| KR | 10-2005-0053653 | 6/2005 |
| KR | 10-2017-0110316 | 10/2017 |
| KR | 10-1969193 | 4/2019 |
| KR | 10-2019-0047592 | 5/2019 |
| KR | 10-2019-0064254 | 6/2019 |
| KR | 10-2019-0088587 | 7/2019 |
| KR | 10-2020-0005692 | 1/2020 |
| KR | 10-2020-0032294 | 3/2020 |

* cited by examiner

DISPLAY DEVICES INCLUDING CONVERSION LAYERS WITH QUANTUM DOTS AND LOW-REFRACTION COLOR FILTERS

CROSS-REFERENCE TO RELATED APPLICATION(S)

This application claims priority to and benefits of Korean Patent Application No. 10-2020-0114162 under 35 U.S.C. § 119, filed in the Korean Intellectual Property Office on Sep. 7, 2020, the entire contents of which are incorporated herein by reference.

BACKGROUND

1. Technical Field

The disclosure relates to a display device.

2. Description of the Related Art

Recently, as interest in information display is increasing, research and development for display devices is continuously conducted.

SUMMARY

The disclosure has been made in an effort to provide a display device that may secure process economic feasibility and simultaneously improve display quality.

Aspects of the disclosure are not limited to any mentioned above, and other technical aspects that are not mentioned may be clearly understood to a person of ordinary skill in the art using the following description.

An embodiment of a display device may include a bank including an opening defining pixels, light emitting elements disposed in the pixels, a color conversion layer disposed on the light emitting elements in the opening, a capping layer overlapping the color conversion layer, and a color filter layer disposed on the capping layer. The color filter layer may include a low refractive material.

The low refractive material may include a hollow particle.

The hollow particle may include at least one of hollow silica, hollow acryl, hollow vinyl, and hollow epoxy.

A content of the hollow particle may be about 50 wt % or less of a solid content of the color filter layer.

A surface of the capping layer may contact the color conversion layer, and another surface of the capping layer may contact the color filter layer.

The capping layer may include at least one of a silicon oxide (SiOx), a silicon nitride (SiNx), a silicon oxynitride (SiOxNy), an aluminum oxide (AlOx), and a titanium oxide (TiOx).

A refractive index of the color filter layer may be in a range of about 1.2 to about 1.6.

The pixels may include a first pixel, a second pixel, and a third pixel. The color conversion layer may include a first color conversion layer disposed in the first pixel, a second color conversion layer disposed in the second pixel, and a light scattering layer disposed in the third pixel. The color filter layer may include a first color filter disposed on the first color conversion layer, a second color filter disposed on the second color conversion layer, and a third color filter disposed on the light scattering layer.

The first color filter, the second color filter, and the third color filter may have different refractive indexes.

A refractive index of the third color filter may be less than a refractive index of the first color filter or a refractive index of the second color filter.

The first color filter, the second color filter, and the third color filter may have different thicknesses.

A thickness of the third color filter may be greater than a thickness of the first color filter or a thickness of the second color filter.

The display device may further include a light blocking pattern disposed at a boundary of the first color filter, the second color filter, or the third color filter.

The light blocking pattern may overlap the bank.

The color conversion layer may include a base resin, and quantum dots dispersed in the base resin.

Each of the light emitting elements may include a first semiconductor layer, a second semiconductor layer disposed on the first semiconductor layer, and an active layer disposed between the first semiconductor layer and the second semiconductor layer.

The color filter layer may be directly disposed on the capping layer.

Another embodiment of a display device may include a bank including an opening defining pixels, light emitting elements disposed in the pixels, a color conversion layer disposed on the light emitting elements in the opening, and a color filter layer disposed on the color conversion layer in the opening. The color filter layer may include a low refractive material.

The display device may further include a capping layer disposed between the color conversion layer and the color filter layer.

A surface of the capping layer may contact the color conversion layer, and another surface of the capping layer may contact the color filter layer.

The color filter layer may be directly disposed on the color conversion layer to contact the color conversion layer.

Particularities of other embodiments are included in the detailed description and drawings.

According to an embodiment of the disclosure, since a color filter layer including a low refractive material may be disposed on a color conversion layer, a separate low refractive layer may be omitted, thereby simplifying a manufacturing process. Since a refractive index and thickness of a color filter layer may be adjusted according to a wavelength of light emitted by each pixel, a reflectance may be optimized, thereby improving luminance and color sense of each pixel.

Effects of embodiments of the disclosure are not limited by what is illustrated in the above, and more various effects are included in the specification.

DETAILED DESCRIPTION OF THE EMBODIMENTS

Figure 1:
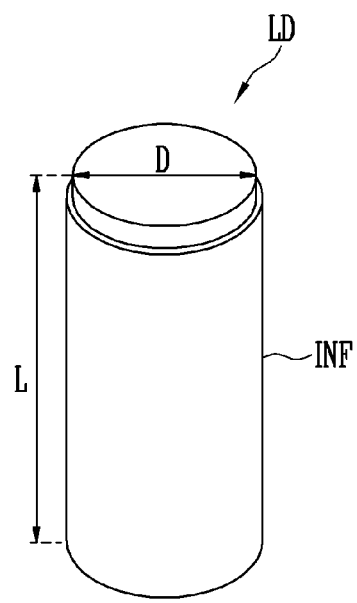
FIG. 1 and FIG. 2 illustrate a schematic perspective view and a schematic cross-sectional view of a light emitting element according to an embodiment, respectively.

Advantages and features of the disclosure and methods of accomplishing the same may be understood more readily by reference to the following detailed description of embodiments and the accompanying drawings. The substance of the disclosure may, however, be embodied in different forms and should not be construed as limited to the embodiments set forth herein. The embodiments are provided so that this disclosure will be thorough and complete, and will fully convey the scope of the disclosure to those skilled in the art.

The terms used herein are for the purpose of describing particular embodiments only and is not intended to be limiting. As used herein, the singular forms "a", "an" and "the" are intended to include the plural forms as well, unless the context clearly indicates otherwise. It will be further understood that the terms "comprise" and/or "comprising", "include" or "including", and "has", "have" or "having", when used in the disclosure, specify the presence of stated elements, steps, operations, and/or devices, but do not preclude the presence or addition of one or more other elements, steps, operations, and/or devices.

The term "connection" or "coupling" may comprehensively mean a physical and/or electrical connection or coupling. Further, this may comprehensively mean a direct or indirect connection or coupling, and an integrated or non-integrated connection or coupling.

It will be understood that when an element or a layer is referred to as being 'on' another element or layer, it can be directly on another element or layer, or an intervening element or layer may also be present. Throughout the specification, the same reference numerals denote the same constituent elements.

Although the terms "first", "second", and the like are used to describe various constituent elements, these constituent elements are not limited by these terms. These terms are used only to distinguish one constituent element from another constituent element. Therefore, first elements described below may be second elements and vice versa while remaining within the technical spirit of the disclosure.

The term "overlap" may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art. The phrase "at least one of" is intended to include the meaning of "at least one selected from the group of" for the purpose of its meaning and interpretation. For example, "at least one of A and B" may be understood to mean "A, B, or A and B." The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Figure 2:
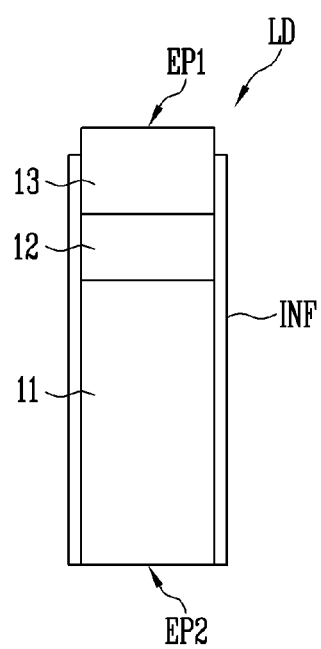

FIG. 1 and FIG. 2 illustrate a schematic perspective view and a schematic cross-sectional view of a light emitting element according to an embodiment, respectively. FIG. 1 and FIG. 2 illustrate a cylindrical shape light emitting element LD, but a type and/or shape of the light emitting element LD is not limited thereto.

Referring to FIG. 1 and FIG. 2, the light emitting element LD may include a first semiconductor layer 11 and a second semiconductor layer 13, and an active layer 12 interposed between the first and second semiconductor layers 11 and 13. For example, when an extending direction of the light emitting element LD is referred to as a length L direction, the light emitting element LD may include the first semiconductor layer 11, the active layer 12, and the second semiconductor layer 13 sequentially stacked on each other along the length L direction.

The light emitting element LD may be provided to have a cylindrical shape extending along a direction. The light emitting element LD may have a first end portion EP1 and a second end portion EP2. One of the first and second semiconductor layers 11 and 13 may be disposed on the first end portion EP1 of the light emitting element LD. The remaining one of the first and second semiconductor layers 11 and 13 may be disposed on the second end portion EP2 of the light emitting element LD.

In some embodiments, the light emitting element LD may be a light emitting element manufactured in a cylindrical shape through an etching method or the like. In the specification, "cylindrical shape" includes a rod-like shape or bar-like shape (for example, with an aspect ratio greater than 1) that may be long in the length L direction, such as a circular cylinder or a polygonal cylinder, but a shape of a cross-section thereof is not particularly limited. For example, the length L of the light emitting element LD may be larger than a diameter D thereof (or a width of a lateral cross-section thereof).

The light emitting element LD may have a size as small as a nanometer scale to a micrometer scale. For example, the light emitting element LD may have the diameter D (or width) and/or the length L ranging from a nano scale to a micro scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include an N-type semiconductor layer. For example, the first semiconductor layer 11 may include a semiconductor material of at least one of InAlGaN, GaN, AlGaN, InGaN, AlN, and InN, and may include a N-type semiconductor layer doped with a first conductive dopant such as Si, Ge, Sn, or the like, or a combination thereof. However, the material included in the first semiconductor layer 11 is not limited thereto, and the first semiconductor layer 11 may be made of various materials.

The active layer 12 may be disposed on the first semiconductor layer 11, and may be formed to have a single-quantum or multi-quantum well structure. A position of the active layer 12 may be variously changed according to a type of the light emitting element LD.

A clad layer (not shown) doped with a conductive dopant may be formed at an upper portion and/or a lower portion of the active layer 12. For example, the clad layer may be formed as an AlGaN layer or an InAlGaN layer. In some embodiments, a material such as AlGaN and InAlGaN may be used to form the active layer 12, and in addition, various materials may form the active layer 12.

The second semiconductor layer 13 may be disposed on the active layer 12, and may include a semiconductor layer of a type different from that of the first semiconductor layer 11. For example, the second semiconductor layer 13 may include a P-type semiconductor layer. For example, the second semiconductor layer 13 may include at least one semiconductor material of InAlGaN, GaN, AlGaN, InGaN, AlN, and InN, and may include a P-type semiconductor layer doped with a second conductive dopant such as Mg. However, the material included in the second semiconductor layer 13 is not limited thereto, and the second semiconductor layer 13 may be formed of various materials.

In case that a voltage of a threshold voltage or more is applied to respective ends of the light emitting element LD, the light emitting device LD may emit light while electron-hole pairs may be combined in the active layer 12. By controlling the light emission of the light emitting element LD by using this principle, the light emitting element LD may be used as a light source for various light emitting devices in addition to pixels of a display device.

The light emitting element LD may further include an insulating film INF provided on a surface thereof. The insulating film INF may be formed on the surface of the light emitting device LD so as to surround at least an outer circumferential surface of the active layer 12, and may further surround a region of the first and second semiconductor layers 11 and 13.

In some embodiments, the insulating film INF may expose respective end portions of the light emitting element LD having different polarities. For example, the insulating film INF may expose one end of each of the first and second semiconductor layers 11 and 13 disposed at the first and second end portions EP1 and EP2 of the light emitting element LD. In another embodiment, the insulating film INF may expose side portions of the first and second semiconductor layers 11 and 13 adjacent to the first and second end portions EP1 and EP2 of the light emitting element LD having different polarities.

In some embodiments, the insulating film INF may be formed as a single layer or multilayer (for example, a double layer made of an aluminum oxide (AlOx) and a silicon oxide (SiOx)) by including at least one insulating material of a silicon oxide (SiOx), a silicon nitride (SiNx), a silicon oxynitride (SiOxNy), an aluminum oxide (AlOx), and a titanium oxide (TiOx), but is not limited thereto. In some embodiments, the insulating film INF may be omitted.

In case that the insulating film INF is provided to cover a surface of the light emitting element LD, particularly, an external circumferential surface of the active layer 12, it may be possible to prevent the active layer 12 from being short-circuited with a first pixel electrode or a second pixel electrode to be described later. Accordingly, electrical stability of the light emitting element LD may be secured.

In case that the insulating film INF is provided on the surface of the light emitting element LD, it may be possible to improve life-span and efficiency thereof by minimizing surface defects of the light emitting element LD. Further, it may be possible to prevent an unwanted short circuit between the light emitting elements LD from occurring even in case that multiple light emitting elements LD may be disposed in close contact with each other.

In an embodiment, the light emitting element LD may further include an additional constituent element in addition to the first semiconductor layer 11, the active layer 12, the second semiconductor layer 13, and/or the insulating film INF surrounding them. For example, the light emitting element LD may additionally include one or more of a phosphor layer, an active layer, a semiconductor layer, and/or an electrode layer disposed on one end side of the first semiconductor layer 11, the active layer 12, and/or the second semiconductor layer 13. For example, a contact electrode may be disposed at the first and second end portions EP1 and EP2 of the light emitting element LD, respectively. FIG. 1 and FIG. 2 illustrate the cylindrical shape light emitting element LD, but the type, structure, and/or shape of the light emitting element LD may be variously changed. For example, the light emitting element LD may be formed in a core-shell structure having a polygonal horn shape.

A light emitting device including the light emitting element LD described above may be used in various types of devices that require a light source in addition to a display device. For example, multiple light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 3:
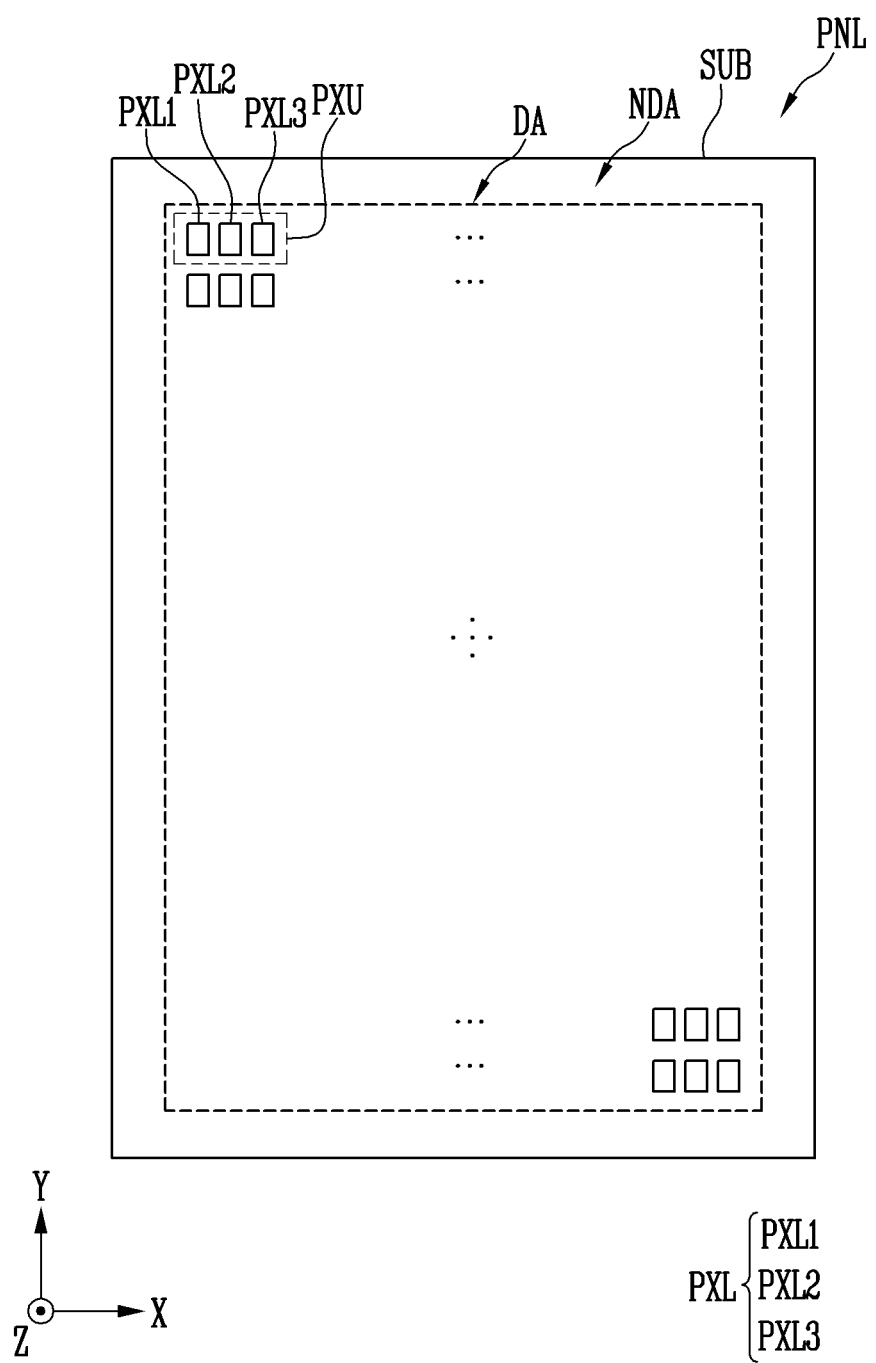
FIG. 3 illustrates a schematic top plan view of a display device according to an embodiment.

FIG. 3 illustrates a schematic top plan view of a display device according to an embodiment.

FIG. 3 illustrates a display device, in particular, a display panel PNL provided in the display device as an example of an electronic device that may use the light emitting element LD described in the embodiments of FIG. 1 to FIG. 2 as a light source. However, the disclosure is not limited thereto, and the display panel PNL may use various light emitting elements as a light source, such as an organic light emitting diode (OLED) including an organic light emitting layer.

Each pixel part PXU of the display panel PNL and each pixel configuring the same may include at least one light emitting element LD. For convenience, FIG. 3 briefly illustrates a structure of the display panel PNL based on a display area DA. However, in some embodiments, at least one driving circuit portion (for example, at least one of a scan driver and a data driver), wires, and/or pads, which are not shown, may be further disposed in the display panel PNL.

Referring to FIG. 3, the display panel PNL may include a substrate SUB and the pixel part PXU disposed on the substrate SUB. The pixel part PXU may include first pixels PXL1, second pixels PXL2, and/or third pixels PXL3. Hereinafter, when arbitrarily referring to one or more pixels among the first pixels PXL1, the second pixels PXL2, and the third pixels PXL3, or when comprehensively referring to two or more types of pixels, they will be referred to as a "pixel PXL" or "pixels PXL".

The substrate SUB may configure a base member of the display panel PNL, and may be a rigid or flexible substrate or film. For example, the substrate SUB may be a hard substrate made of glass or tempered glass, a flexible substrate (or a thin film) made of a plastic or metallic material, or at least one layered insulation layer. The material and/or physical properties of the substrate SUB are not particularly limited.

In an embodiment, the substrate SUB may be substantially transparent. Here, "substantially transparent" may mean that light may be transmitted at a transmittance or more. In another embodiment, the substrate SUB may be translucent or opaque. The substrate SUB may include a reflective material according to an embodiment.

The display panel PNL and the substrate SUB for forming the display panel may include a display area DA for displaying an image and a non-display area NDA excluding the display area DA.

The pixels PXL may be disposed in the display area DA. In the non-display area NDA, various wires connected to the pixels PXL of the display area DA, pads, and/or internal circuit parts may be disposed. The pixels PXL may be regularly arranged according to a stripe or PenTile® arrangement structure. However, the arrangement structure of the pixels PXL is not limited thereto, and the pixels PXL may be arranged in the display area DA in various structures and/or methods.

In some embodiments, two or more types of pixels PXL emitting light of different colors may be disposed in the display area DA. For example, in the display area DA, the first pixels PXL1 emitting light of the first color, the second pixels PXL2 emitting light of the second color, and the third pixels PXL3 emitting light of the third color may be arranged. At least one set of first to third pixels PXL1, PXL2, and PXL3 disposed to be adjacent to each other may form one pixel part PXU that may emit light of various colors. For example, each of the first to third pixels PXL1, PXL2, and PXL3 may be a sub-pixel emitting light of a color. In some embodiments, the first pixel PXL1 may be a red pixel that emits red light, the second pixel PXL2 may be a green pixel that emits green light, and the third pixel PXL3 may be a blue pixel that emits blue light, but the disclosure is not limited thereto.

In an embodiment, the first pixel PXL1, the second pixel PXL2, and the third pixel PXL3 may be each provided with a first color light emitting element, a second color light emitting element, and a third color light emitting element as a light source, respectively, so that they respectively emit light of the first color, second color, and third color. In another embodiment, the first pixel PXL1, the second pixel PXL2, and the third pixel PXL3 may be provided with light emitting elements of the same color, and include color conversion layers and/or color filters of different colors disposed on respective light emitting elements, so that they may emit light of the first color, the second color, and the third color, respectively. However, the color, type, and/or number of pixels PXL configuring each pixel part PXU are not particularly limited. For example, the color of light emitted by each pixel PXL may be variously changed.

The pixel PXL may include at least one light source driven by a control signal (for example, a scan signal and a data signal) and/or a power source (for example, a first power source and a second power source). In an embodiment, the light source may include at least one light emitting device LD according to one of the embodiments of FIG. 1 and FIG. 2, for example, ultra-small cylindrical shape light emitting elements LD having a size as small as nanometer scale to micrometer scale. However, the disclosure is not limited thereto, and various types of light emitting elements LD may be used as a light source of the pixel PXL.

In an embodiment, each pixel PXL may be configured as an active pixel. However, the type, structure, and/or driving method of pixels PXL that may be applied to the display device are not particularly limited. For example, each pixel PXL may be configured as a pixel of a passive or active light emitting display device of various structures and/or driving methods.

Figure 4:
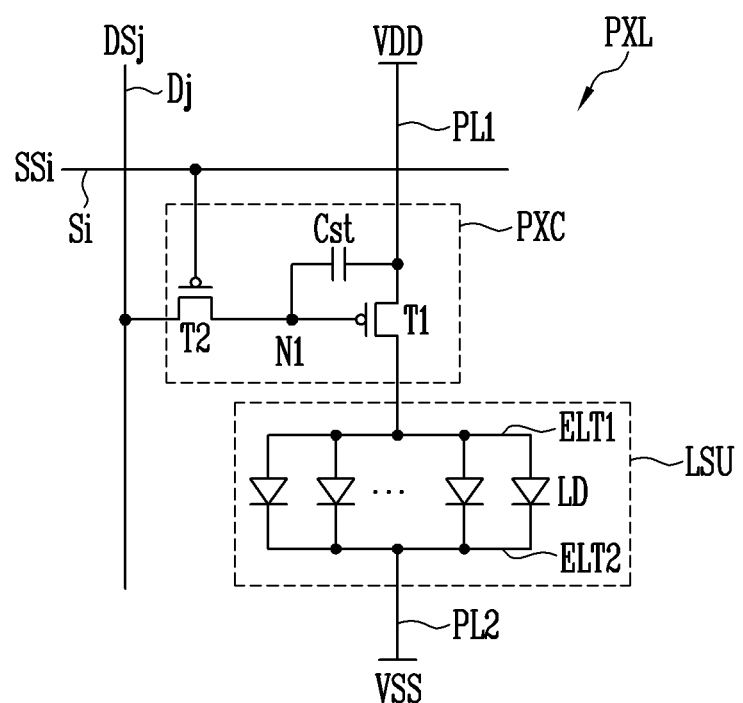
FIG. 4 to FIG. 6 illustrate schematic circuit diagrams of a pixel according to an embodiment.
Figure 5:
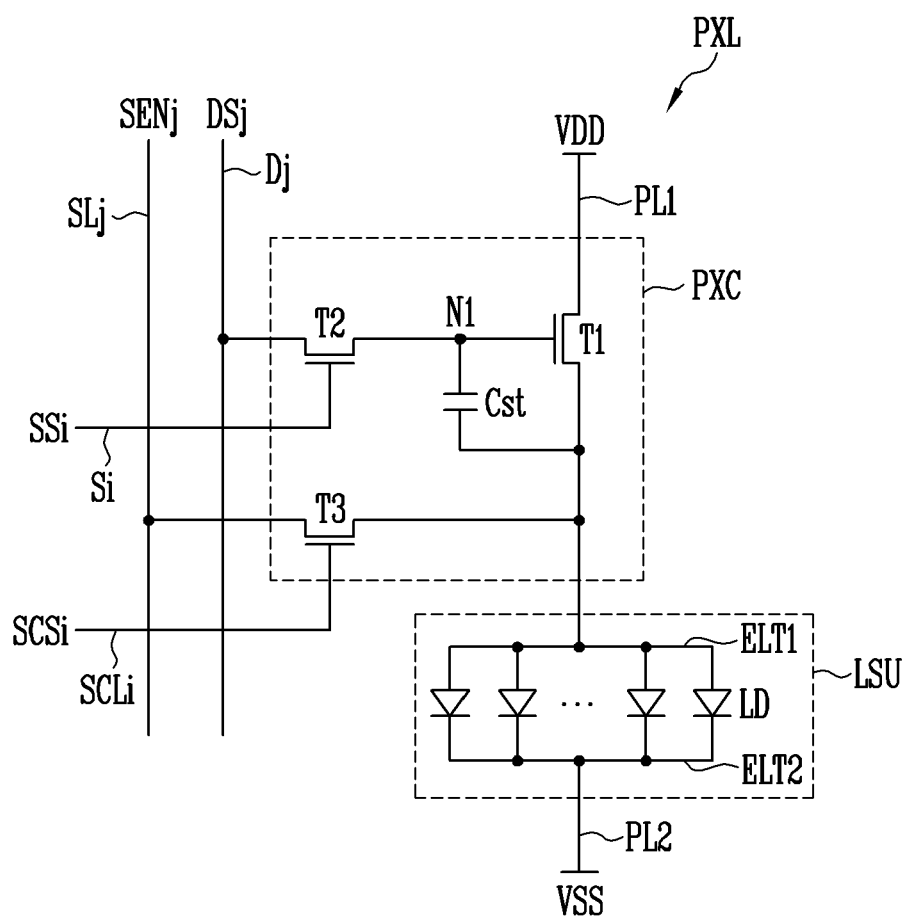
Figure 6:
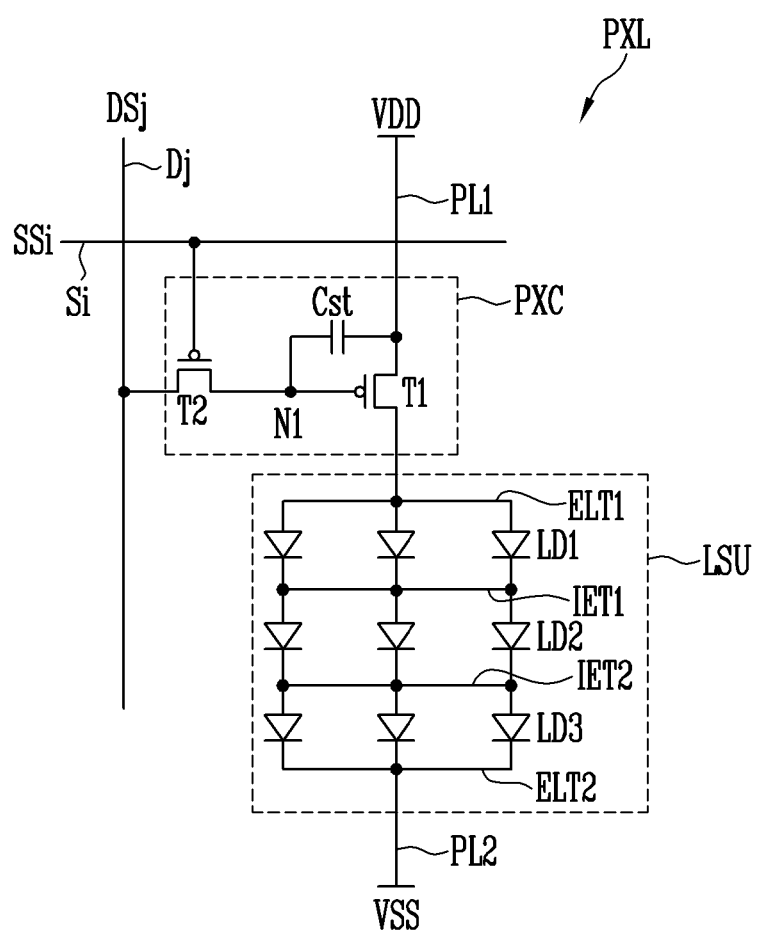

FIG. 4 to FIG. 6 illustrate schematic circuit diagrams of a pixel according to an embodiment. For example, FIG. 4 to FIG. 6 illustrate an embodiment of the pixel PXL applicable to an active display device. However, the types of the pixel PXL and of the display device are not limited thereto.

In some embodiments, the pixel PXL shown in FIG. 4 to FIG. 6 may be one of the first pixel PXL1, the second pixel PXL2, and the third pixel PXL3 provided in the display panel PNL of FIG. 3. The first pixel PXL1, the second pixel PXL2, and the third pixel PXL3 may have substantially the same or similar structure.

Referring to FIG. 4, the pixel PXL may include a light source part LSU for generating light at luminance corresponding to a data signal, and a pixel circuit PXC for driving the light source part LSU.

The light source part LSU may include at least one light emitting element connected between a first power source VDD and a second power source VSS. For example, the light source part LSU may include a first electrode ELT1 (also referred to as a "first pixel electrode" or "first alignment electrode") connected to the first power VDD via the pixel circuit PXC and a first power line PL1, a second electrode ELT2 (also referred to as a "second pixel electrode" or "second alignment electrode") connected to the second power VSS through a second power line PL2, and light emitting elements LD connected in the same direction between the first and second electrodes ELT1 and ELT2. In an embodiment, the first electrode ELT1 may be an anode electrode, and the second electrode ELT2 may be a cathode electrode.

Each of the light emitting elements LD may include a first end portion (for example, a P-type end portion) connected to the first power source VDD through the first electrode ELT1 and/or the pixel circuit PXC, and a second end portion (for example, an N-type end portion) connected to the second power source VSS through the second electrode ELT2. For example, the light emitting elements LD may be connected in parallel in a forward direction between the first and second electrodes ELT1 and ET2. Respective light emitting elements LD connected in the forward direction between the first power source VDD and the second power source VSS may configure respective effective light sources, and these effective light sources may be combined to configure the light source part LSU of the pixel PXL.

The first and second power sources VDD and VSS may have different potentials so that the light emitting elements LD may emit light. For example, the first power source VDD may be set as a high potential power source, and the second power source VSS may be set as a low potential power source. A potential difference between the first and second power sources VDD and VSS may be set to be equal to or higher than a threshold voltage of the light emitting elements LD during at least a light emitting period of the pixel PXL.

A set of end portions (for example, P-type end portions) of the light emitting elements LD configuring each light source part LSU may be commonly connected to the pixel circuit PXC through an electrode (for example, the first pixel electrode ET1 of each pixel PXL) of the light source part LSU, and may be connected to the first power source VDD through the pixel circuit PXC and the first power line PL1. Another set of end portions (for example, N-type end portions) of the light emitting elements LD may be commonly connected to the second power source VSS through another electrode (for example, the second electrode ELT2 of each pixel PXL) of the light source part LSU and the second power wire PL2.

The light emitting elements LD may emit light with luminance corresponding to a driving current supplied through the corresponding pixel circuit PXC. For example, during each frame period, the pixel circuit PXC may supply a driving current corresponding to a gray value to be displayed in the corresponding frame to the light source part LSU. The driving current supplied to the light source part LSU may be divided to flow in the light emitting elements LD that may be connected in a forward direction. Therefore, while each light emitting element LD emits light with a luminance corresponding to the current flowing therein, the light source part LSU may emit light having a luminance corresponding to the driving current.

The pixel circuit PXC may be connected between the first power source VDD and the first electrode ELT1. The pixel circuit PXC may be connected to a scan line Si and a data line Dj of the pixel PXL. For example, in case that the pixel PXL is disposed in an i-th horizontal line (row) (i may be a natural number) and a j-th vertical line (column) (j may be a natural number) of the display area DA, the pixel circuit PXC of the pixel PXL may be connected to an i-th scan line Si and a j-th data line Dj of the display area DA.

In some embodiments, the pixel circuit PXC may include transistors and at least one capacitor. For example, the pixel circuit PXC may include a first transistor T1, a second transistor T2, and a storage capacitor Cst.

The first transistor T1 may be connected between the first power source VDD and the light source part LSU. For example, a first electrode (for example, a source electrode) of the first transistor T1 may be connected to the first power source VDD, and a second electrode (for example, a drain electrode) of the first transistor T1 may be connected to the first electrode ELT1. A gate electrode of the first transistor T1 may be connected to a first node N1. The first transistor T1 may control a driving current supplied to the light source part LSU in response to a voltage of the first node N1. For example, the first transistor T1 may be a driving transistor that controls a driving current of the pixel PXL.

The second transistor T2 may be connected between the data line Dj and the first node N1. For example, a first electrode (for example, a source electrode) of the second transistor T2 may be connected to the data line Dj, and a second electrode (for example, a drain electrode) of the second transistor T2 may be connected to the first node N1. A gate electrode of the second transistor T2 may be connected to the scan line Si. In case that a scan signal SSi of a gate-on voltage (for example, a low level voltage) may be supplied from the scan line Si, the second transistor T2 may be turned on to electrically connect the data line Dj and the first node N1.

For each frame period, a data signal DSj of the corresponding frame may be supplied to the data line Dj, and the data signal DSj may be transmitted to the first node N1 through the turned-on transistor T2 during a period in which the scan signal SSi of the gate-on voltage may be supplied. For example, the second transistor T2 may be a switching transistor for transmitting each data signal DSj to the inside of the pixel PXL.

An electrode of the storage capacitor Cst may be connected to the first power source VDD, and another electrode thereof may be connected to the first node N1. The storage capacitor Cst may be charged with a voltage that corresponds to the data signal DSj supplied to the first node N1 during each frame period.

In FIG. 4, the transistors included in the pixel circuit PXC, for example, the first and second transistors T1 and T2 are all illustrated as P-type transistors, but are not limited thereto, and a least one of the first and second transistors T1 and T2 may be changed to an N-type transistor. The pixel circuit PXC may be configured as a pixel circuit having various structures and/or driving methods.

Referring to FIG. 5, the pixel circuit PXC may be further connected to a sensing control line SCLi and a sensing line SLj. For example, the pixel circuit PXC of the pixel PXL disposed at an i-th horizontal line and a j-th vertical line of the display area DA may be connected to an i-th sensing control line SCLi and a j-th sensing line SLj of the display area DA. The pixel circuit PXC may further include a third transistor T3. In another embodiment, the sensing line SLj may be omitted, and the characteristics of the pixel PXL may also be detected by detecting a sensing signal SENj through the data line Dj of the corresponding pixel PXL (or adjacent pixel), The third transistor T3 may be connected between the first transistor T1 and the sensing line SLj. For example, an electrode of the third transistor T3 may be connected to an electrode (for example, a source electrode) of the first transistor T1 connected to the first electrode ELT1, and another electrode thereof may be connected to the sensing line SLj. In case that the sensing line SLj may be omitted, the another electrode of the third transistor T3 may be connected to the data line Dj.

A gate electrode of the third transistor T3 may be connected to the sensing control line SCLi. In case that the sensing control line SCLi is omitted, the gate electrode of the third transistor T3 may be connected to the scan line Si. The third transistor T3 may be turned on by a sensing control signal SCSi of a gate-on voltage (for example, a high level voltage) supplied to the sensing control line SCLi during a sensing period to electrically connect the sensing line SLj and the first transistor T1.

In some embodiments, the sensing period may be a period for extracting characteristics (for example, a threshold voltage of the first transistor T1) of each of the pixels PXL disposed in the display area DA. During the sensing period, the first transistor T1 may be turned on by supplying a reference voltage at which the first transistor T1 may be turned on to the first node N1 through the data line Dj and the second transistor T2 and by connecting each pixel PXL to a current source or the like. By supplying the sensing control signal SCSi of a gate-on voltage to the third transistor T3 to turn on the third transistor T3, the first transistor T1 may be connected to the sensing line SLj. Thereafter, the sensing signal SENj may be obtained through the sensing line SLj, and the characteristics of each pixel PXL in addition to the threshold voltage of the first transistor T1 may be detected by using the sensing signal SENj. Information on the characteristics of each pixel PXL may be used to convert image data so that a characteristic difference between the pixels PXL disposed in the display area DA may be compensated.

FIG. 5 illustrates an embodiment in which the first, second, and third transistors T1, T2, and T3 may be all N-type transistors, but the disclosure is not limited thereto. For example, at least one of the first, second, and third transistors T1, T2, and T3 may be changed to a P-type transistor.

FIG. 4 and FIG. 5 illustrate embodiments in which effective light sources forming each light source part LSU, for example, the light emitting elements LD may be all connected in parallel, but the disclosure is not limited thereto. For example, as shown in FIG. 6, the light source part LSU of each pixel PXL may include at least two stages in series. In describing embodiments of FIG. 6, a detailed description of the configuration (for example, the pixel circuit PXC) that is similar to or the same as embodiments of FIG. 4 and FIG. 5 will be omitted.

Referring to FIG. 6, the light source part LSU may include at least two light emitting elements connected in series to each other. For example, the light source part LSU may include a first light emitting element LD1, a second light emitting element LD2, and a third light emitting element LD3 that may be connected in series in a forward direction between the first power source VDD and the second power source VSS. Each of the first, second, and third light emitting elements LD1, LD2, and LD3 may configure an effective light source.

Hereinafter, when referring to a specific light emitting element among the first, second, and third light emitting elements LD1, LD2, and LD3, the corresponding light emitting element may be referred to as a "first light emitting element LD1", "second light emitting element LD2", or "third light-emitting element LD3". When arbitrarily referring to at least one light emitting element among the first, second, and third light emitting elements LD1, LD2, and LD3, or generically referring to the first, second, and third light emitting elements LD1, LD2, and LD3, it will be referred to as "light emitting element LD" or "light emitting elements LD".

A first end portion (for example, P-type end portion) of the first light emitting element LD1 may be connected to the first power source VDD via the first electrode ELT1 (for example, first pixel electrode) of the light source part LSU. A second end portion (for example, N-type end portion) of the first light emitting element LD1 may be connected to a first end portion (for example, P-type end portion) of the second light emitting element LD2 through a first middle electrode IET1.

The first end portion of the second light emitting element LD2 may be connected to a second end portion of the first light emitting element LD1. The second end portion (for example, N-type end) of the second light emitting element LD2 may be connected to a first end portion (for example, P-type end portion) of the third light emitting element LD3 through a second middle electrode IET2.

The first end portion of the third light emitting element LD3 may be connected to a second end portion of the second light emitting element LD2. A second end portion of the third light emitting element LD3 (for example, N-type end portion) may be connected to the second power supply VSS via the second electrode (for example, second pixel electrode ELT2) of the light source part LSU. In the above-described manner, the first, second, and third light emitting elements LD1, LD2, and LD3 may be sequentially connected in series between the first and second electrodes ELT1 and ELT2 of the light source part LSU.

FIG. 6 illustrates an embodiment of connecting the light emitting elements LD in a three-stage serial structure, but the disclosure is not limited thereto, and two light emitting elements LD may be connected in a two-stage serial structure, or four or more light emitting elements LD may be connected in a series structure of four or more stages.

Assuming that the same luminance may be expressed using the light-emitting elements LD of the same condition (for example, the same size and/or number), in the light source part LSU having a structure in which the light emitting elements LD may be connected in series compared to the light source part LSU having a structure in which the light emitting elements LD may be connected in parallel, a voltage applied between the first and second electrodes ELT1 and ELT2 may increase, and a driving current flowing through the light source part LSU may decrease. Therefore, in case that the light source part LSU of each pixel PXL is configured by applying the serial structure, a panel current flowing through the display panel PNL may be reduced.

As in the above-described embodiment, each light source part LSU may be connected to the first and second power sources VDD and VSS in a forward direction to be able to include light emitting elements LD configuring each effective light source. The connection structure between the light emitting elements LD may be variously changed according to embodiments. For example, the light emitting elements LD may be connected to each other only in series or in parallel, or may be connected in a series/parallel mixed structure.

Figure 7:
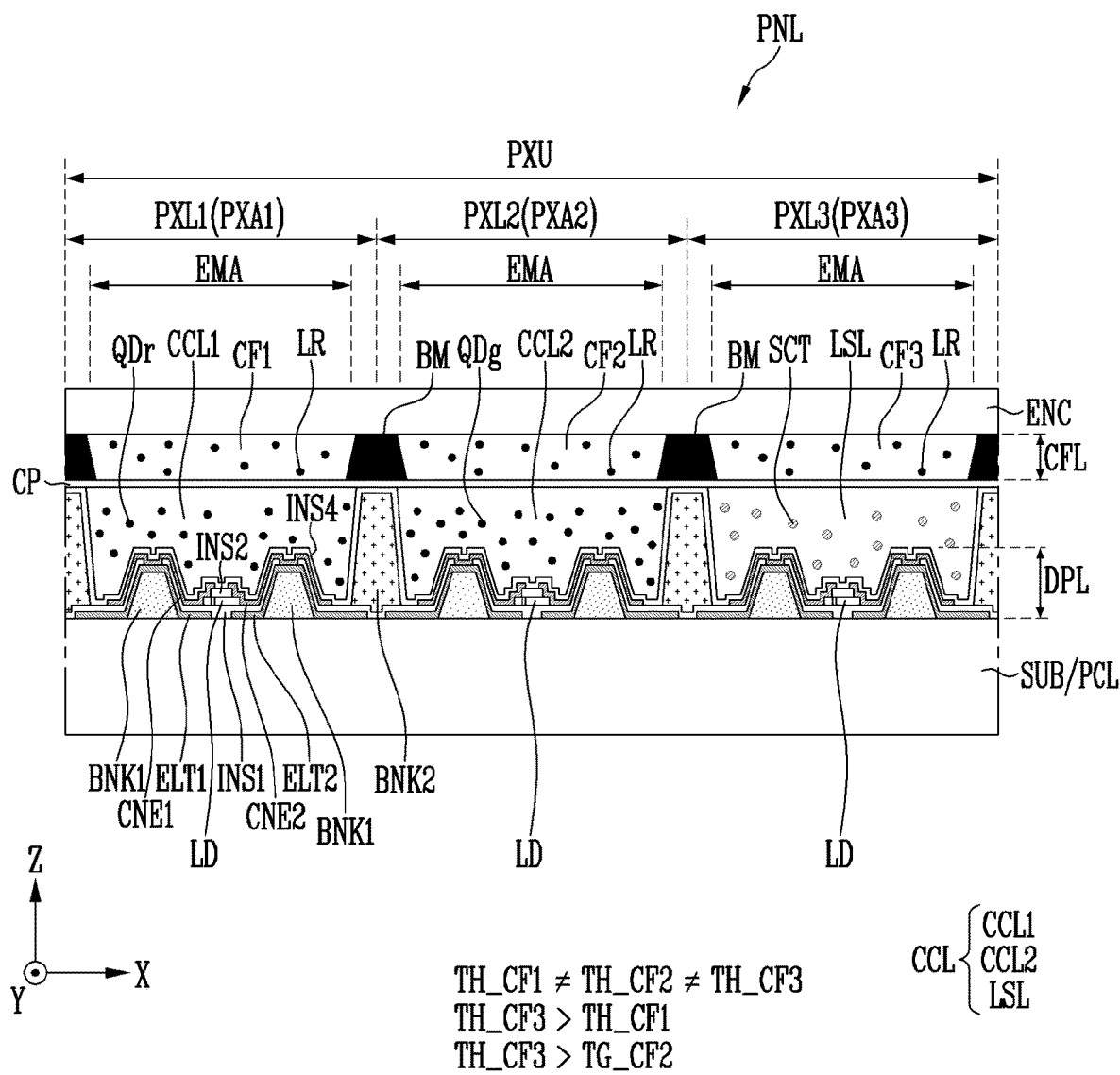
FIG. 7 illustrates a schematic cross-sectional view of a display device according to an embodiment.
Figure 8:
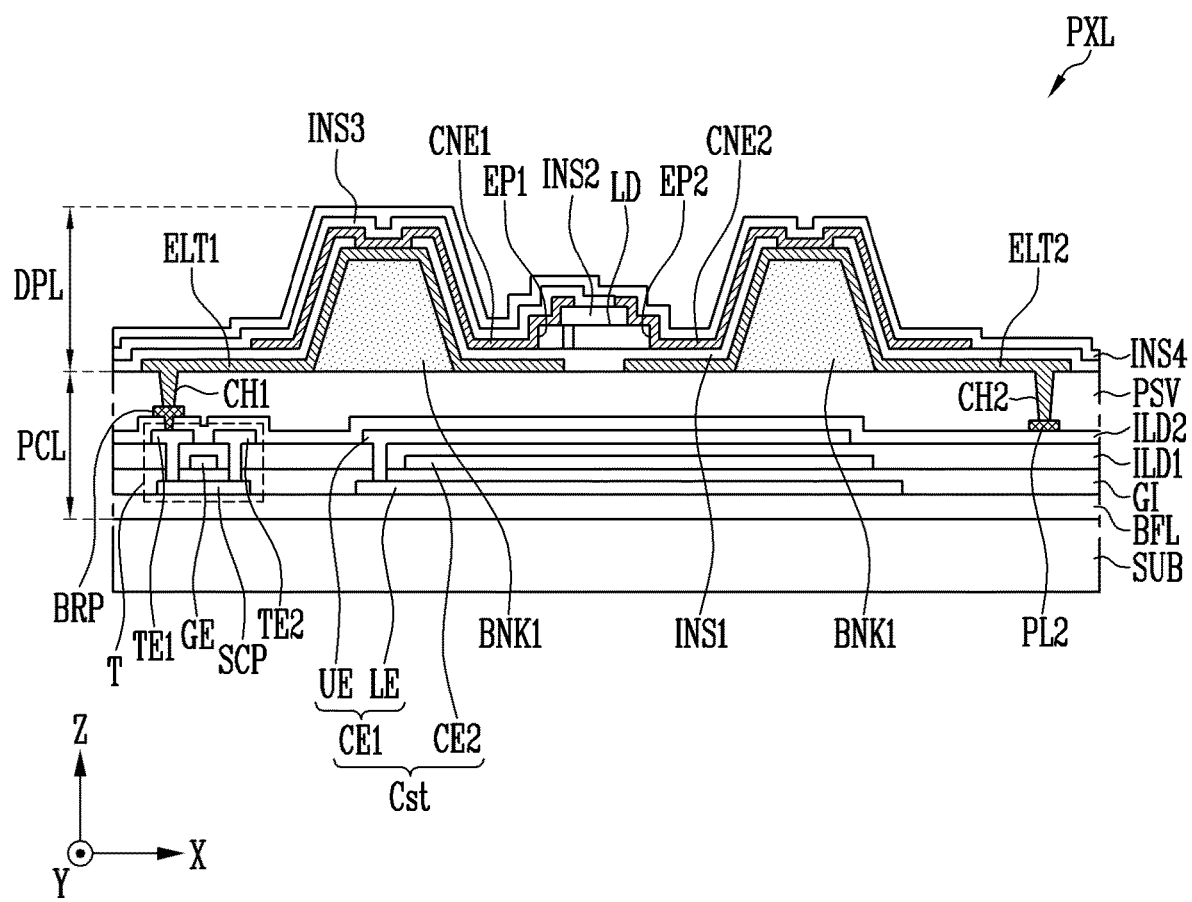
FIG. 8 and FIG. 9 illustrate schematic cross-sectional views of a pixel of FIG. 7.
Figure 9:
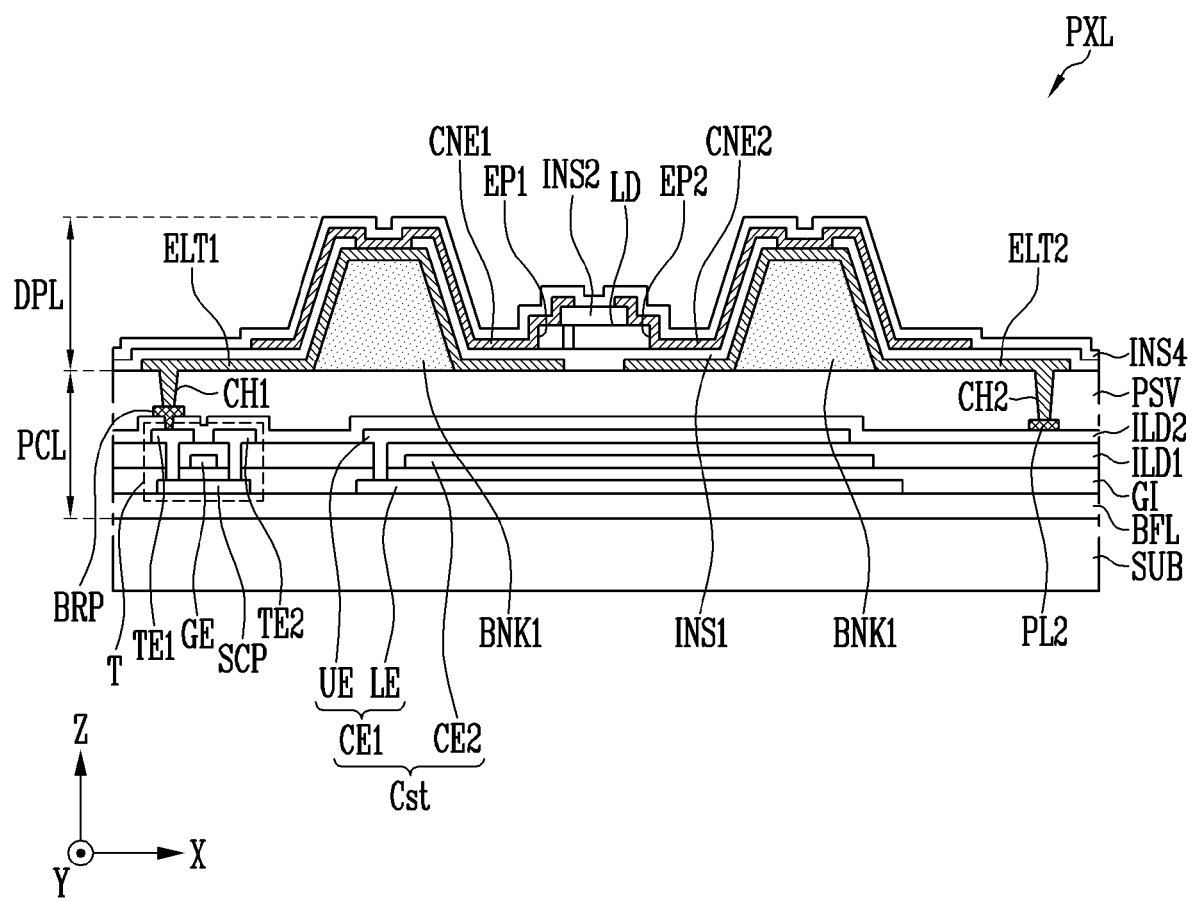

FIG. 7 illustrates a schematic cross-sectional view of a display device according to an embodiment. FIG. 8 and FIG. 9 illustrate schematic cross-sectional views of a pixel of FIG. 7. FIG. 10 to FIG. 13 illustrate schematic graphs of reflectance according to a refractive index and thickness of a color filter layer.

FIG. 7 illustrates a cross-section of a display device, particularly a display panel PNL provided in the display device, and may be based on an area in which one pixel part PXU including the first pixel PXL1, the second pixel PXL2, and the third pixel PXL3 adjacent to each other may be disposed.

FIG. 8 and FIG. 9 schematically illustrate the structure of a pixel PXL based on a light emitting element LD, respectively, and illustrate a transistor T (for example, the first transistor T1 in FIG. 4) and the storage capacitor Cst connected to the first electrode ELT1 for showing various circuit elements configuring the pixel circuit PXC, respectively. Hereinafter, when it is not necessary to separately specify the first transistor T1, the first transistor T1 will also be referred to as a "transistor T".

Structures of the transistors T and the storage capacitor Cst and/or a position of each layer thereof are not limited to the embodiments shown in FIG. 8 and FIG. 9, and may be variously changed according to embodiments. In an embodiment, the transistors T included in each pixel circuit PXC may have substantially the same or similar structure to each other, but are not limited thereto. For example, in another embodiment, at least one of the transistors T included in the pixel circuit PXC may have a different cross-sectional structure from the remaining transistors T, and/or may be disposed on a different layer.

Referring to FIG. 7 to FIG. 9, the pixel PXL and the display device including the same may include a substrate SUB, and a circuit layer PCL, a display layer DPL, a color conversion layer CCL, and a color filter layer CFL that may be disposed on a surface of the substrate SUB.

The circuit layer PCL may include circuit elements for configuring the pixel circuit PXC of each pixel PXL, and various wires connected to the circuit elements. The display layer DPL may include electrodes (for example, the first and second electrodes ELT1 and ELT2 and/or the first and second contact electrodes CNE1 and CNE2) and the light emitting elements LD, for configuring the light source part LSU of each pixel PXL.

The circuit layer PCL may include at least one circuit element electrically connected to the light emitting elements LD of each pixel PXL. For example, the circuit layer PCL may include transistors T and a storage capacitor Cst that may be disposed in each pixel PXL to form a pixel circuit PXC of a corresponding pixel PXL. The circuit layer PCL may further include at least one power wire and/or signal wire connected to each pixel circuit PXC and/or light source part LSU. For example, the circuit layer PCL may include the first power wire PL1, the second power wire PL2, and the scan line Si and the data line Dj of each pixel PXL. On the other hand, in case that the pixel circuit PXC is omitted and the light source part LSU of each pixel PXL is connected (e.g., directly connected) to the first and second power wires PL1 and PL2 (or signal wires), the circuit layer PCL may be omitted.

The circuit layer PCL may include insulation layers. For example, the circuit layer PCL may include a buffer layer BFL, a gate insulation layer GI, a first interlayer insulation layer ILD1, a second interlayer insulation layer ILD2, and/or a passivation layer PSV, sequentially stacked on each other on one side of the substrate SUB. The circuit layer PCL may selectively further include at least one light blocking pattern (not shown) and the like disposed under at least some of the transistors T.

The buffer layer BFL may prevent impurities from diffusing into each circuit element. The buffer layer BFL may be formed as a single layer, but may also be formed as a multilayer of two layers or more. In case that the buffer layer BFL is provided as the multilayer, respective layers may be made of the same material or different materials. Various circuit elements such as the transistors T and the storage capacitor Cst, and various wires connected to the circuit elements may be disposed on the buffer layer BFL. In some embodiments, the buffer layer BFL may be omitted. At least one circuit element and/or wire may be disposed on (e.g., directly disposed on) a surface of the substrate SUB.

Each transistor T may include a semiconductor pattern SCP (also referred to as a "semiconductor layer" or "active layer"), a gate electrode GE, first and second transistor electrodes TE1 and TE2. FIG. 8 and FIG. 9 illustrate an embodiment in which each transistor T includes the first and second transistor electrodes TE1 and TE2 formed separately from the semiconductor pattern SCP, but the disclosure is not limited thereto. For example, in another embodiment, the first and/or second transistor electrodes TE1 and/or TE2 provided in at least one transistor T may be integrated with each semiconductor pattern SCP.

The semiconductor pattern SCP may be disposed on the buffer layer BFL. For example, the semiconductor pattern SCP may be disposed between the substrate SUB on which the buffer layer BFL may be formed and the gate insulation layer GI. The semiconductor pattern SCP may include a first region contacting each first transistor electrode TE1, a second region contacting each second transistor electrode TE2, and a channel region disposed between the first and second regions. In some embodiments, one of the first and second regions may be a source region, and another thereof may be a drain region.

In some embodiments, the semiconductor pattern SCP may be a semiconductor pattern made of polysilicon, amorphous silicon, an oxide semiconductor, or the like, or a combination thereof. The channel region of the semiconductor pattern SCP may be an intrinsic semiconductor as a semiconductor pattern that may not be doped with impurities, and each of the first and second regions of the semiconductor pattern SCP may be a semiconductor pattern doped with impurities.

In an embodiment, the semiconductor patterns SCP of the transistors T included in each pixel circuit PXC may be made of substantially the same or similar material. For example, the semiconductor pattern SCP of the transistors T may be of a material of polysilicon, amorphous silicon, an oxide semiconductor, or a combination thereof.

In another embodiment, some of the transistors T and the remaining transistors thereof may include the semiconductor patterns SCP made of different materials. For example, the semiconductor pattern SCP of some of the transistors T may be made of polysilicon, amorphous silicon, or a combination thereof, and the semiconductor pattern SCP of the remaining transistors T may be made of an oxide semiconductor.

The gate insulation layer GI may be disposed on the semiconductor pattern SCP. For example, the gate insulation layer GI may be disposed between the semiconductor pattern SCP and the gate electrode GE. The gate insulation layer GI may be formed as a single layer or multilayer, and may include a silicon nitride (SiNx), a silicon oxide (SiOx), a silicon oxynitride (SiOxNy), or a combination thereof, and various types of organic/inorganic insulating materials.

The gate electrode GE may be disposed on the gate insulation layer GI. For example, the gate electrode GE may be disposed to overlap the semiconductor pattern SCP with the gate insulation layer GI interposed therebetween. FIG. 8 and FIG. 9 illustrate a top-gate structure of transistor T, but in another embodiment, the transistor T may have a bottom-gate structure. The gate electrode GE may be disposed to overlap the semiconductor pattern SCP under the semiconductor pattern SCP.

The first interlayer insulation layer ILD1 may be disposed on the gate electrode GE. For example, the first interlayer insulation layer ILD1 may be disposed between the gate electrode GE and the first and second transistor electrodes TE1 and TE2. The first interlayer insulation layer ILD1 may be formed as a single layer or multilayer, and may include at least one inorganic insulating material and/or organic insulating material. For example, the first interlayer insulation layer ILD1 may include a silicon nitride (SiNx), a silicon oxide (SiOx), a silicon oxynitride (SiOxNy), or a combination thereof, and various types of organic/inorganic insulating materials, and the materials included in the first interlayer insulation layer ILD1 are not particularly limited.

The first and second transistor electrodes TE1 and TE2 may be disposed on each semiconductor pattern SCP with at least one first interlayer insulation layer ILD1 therebetween. For example, the first and second transistor electrodes TE1 and TE2 may be disposed on different end portions of the semiconductor pattern SCP with the gate insulation layer GI and the first interlayer insulation layer ILD1 therebetween. The first and second transistor electrodes TE1 and TE2 may be electrically connected to each semiconductor pattern SCP. For example, the first and second transistor electrodes TE1 and TE2 may be connected to the first and second regions of the semiconductor pattern SCP through respective contact holes passing through the gate insulation layer GI and the first interlayer insulation layer ILD1. In some embodiments, one of the first and second transistor electrodes TE1 and TE2 may be a source electrode, and another thereof may be a drain electrode.

At least one transistor T provided in the pixel circuit PXC may be connected to at least one pixel electrode. For example, the transistor T may be electrically connected to the first electrode ELT1 of the corresponding pixel PXL through a contact hole (for example, first contact hole CH1) and/or bridge pattern BRP passing through the passivation layer PSV.

The storage capacitor Cst may include a first capacitor electrode CE1 and a second capacitor electrode CE2 overlapping each other. Each of the first and second capacitor electrodes CE1 and CE2 may be configured of a single layer or multilayer. At least one of the first and second capacitor electrodes CE1 and CE2 may be disposed on the same layer as at least one electrode or the semiconductor pattern SCP configuring the first transistor T1.

For example, the first capacitor electrode CE1 may be configured as a multilayer electrode that includes a lower electrode LE disposed on the same layer as the semiconductor pattern SCP of the first transistor T1, and an upper electrode UE disposed on the same layer as the first and second transistor electrodes TE1 and TE2 of the first transistor T1 and electrically connected to the lower electrode LE. The second capacitor electrode CE2 may be configured as a single layer electrode that may be disposed on the same layer as the gate electrode of the first transistor T1 and may be disposed between the lower electrode LE and the upper electrode UE of the first capacitor electrode CE1. However, the structure and/or position of each of the first and second capacitor electrodes CE1 and CE2 may be variously changed. For example, one of the first and second capacitor electrodes CE1 and CE2 may include a conductive pattern disposed on a layer different from the electrodes (for example, the gate electrode GE, and the first and second transistor electrodes TE1 and TE2) and the semiconductor pattern SCL that configure the first transistor T1. For example, the first capacitor electrode CE1 or the second capacitor electrode CE2 may have a single-layered or multilayered structure including a conductive pattern disposed on the second interlayer insulation layer ILD2.

In an embodiment, at least one signal wire and/or power wire connected to each pixel PXL may be disposed on the same layer as one electrode of circuit elements included in the pixel circuit PXC. For example, the scan line Si of each pixel PXL may be disposed on the same layer as the gate electrodes GE of transistors T, and the data line Dj of each pixel PXL may be disposed on the same layer as the first and second transistor electrodes TE1 and TE2 of transistors T.

The first and/or second power wires PL1 and PL2 may be disposed on the same layer as or different layers from the gate electrodes GE or first and second transistor electrodes TE1 and TE2 of the transistors T. For example, the second power wire PL2 for supplying the second power source VSS may be disposed on the second interlayer insulation layer ILD2 to be at least partially covered by the passivation layer PSV. The second power wire PL2 may be electrically connected to the second electrode ELT2 of the light source part LSU disposed on the passivation layer PSV through the second contact hole CH2 passing through the passivation layer PSV. However, the position and/or structure of the first and/or second power wires PL1 and PL2 may be variously changed. For example, the second power line PL2 may be disposed on the same layer as the gate electrodes GE of the transistors T or the first and second transistor electrodes TE1 and TE2 to be electrically connected to the second electrode ELT2 through at least one bridge pattern (not shown) and/or the second contact hole CH2.

The second interlayer insulation layer ILD2 may be disposed at an upper portion of the first interlayer insulation layer ILD1, and may cover the first and second transistor electrodes TE1 and TE2 and/or storage capacitor Cst disposed on the first interlayer insulation layer ILD1. The second interlayer insulation layer ILD2 may be formed as a single layer or multilayer, and may include at least one inorganic insulating material and/or organic insulating material. For example, the second interlayer insulation layer ILD2 may include a silicon nitride (SiNx), a silicon oxide (SiOx), a silicon oxynitride (SiOxNy), or a combination thereof, and various types of organic/inorganic insulating materials, but is not particularly limited thereto.

The bridge pattern BRP, the first power wire PL1, and/or the second Power wire PL2 for connecting at least one circuit element (for example, the first transistor T1) provided in the pixel circuit PXC to the first electrode ELT1 may be disposed on the second interlayer insulation layer ILD2. However, in some embodiments, the second interlayer insulation layer ILD2 may be omitted. The bridge pattern BRP of FIG. 8 and FIG. 9 may be omitted, and the second power wire PL2 may be disposed on a layer in which one electrode of the transistor T may be disposed.

The passivation layer PSV may be disposed on the circuit elements including the transistors T and the storage capacitor Cst, and/or on the wires including the first and second power wires PL1 and PL2. The passivation layer PSV may be formed as a single layer or multilayer, and may include at least one inorganic insulating material and/or organic insulating material. For example, the passivation layer PSV may include at least one organic insulation layer, and may serve to substantially flatten a surface of the circuit layer PCL.

The display layer DPL may be disposed on the passivation layer PSV of the circuit layer PCL. The display layer DPL may include at least one pair of first electrodes ELT1 and second electrode ELT2 disposed in the light emitting area EMA of each pixel PXL and configuring each light source part LSU, and at least one light emitting element LD connected between the first electrode ELT1 and the second electrode ELT2. On the other hand, FIG. 7 to FIG. 9 each illustrates one light emitting element LD disposed in each pixel PXL, but each pixel PXL may include light emitting elements LD connected between the first and second electrodes ELT1 and ELT2 as in embodiments of FIG. 4. Accordingly, hereinafter, assuming that the pixel PXL includes light emitting elements LD, each embodiment will be described.

The display layer DPL may further include the first and second contact electrodes CNE1 and CNE2 for more stably connecting the light emitting elements LD between the first and second electrodes ELT1 and ELT2, and a first bank BNK1 for upwardly protruding one area of each of the first and second electrodes ELT1 and ELT2 and/or the first and second contact electrodes CNE1 and CNE2. The display layer DPL may further include at least one conductive layer and/or an insulation layer.

The first bank BNK1 may be disposed on the circuit layer PCL. The first banks BNK1 may be formed in a separate or integral pattern. The first bank BNK1 may be protruded in a height direction of the substrate SUB, for example, a third direction (Z-axis direction).

The first bank BNK1 may have various shapes according to embodiments. In an embodiment, the first bank BNK1 may be a bank structure having a positive taper structure. For example, the first bank BNK1 may be formed to have an inclined surface inclined at an angle with respect to the substrate SUB as shown in FIG. 7 to FIG. 9. However, the disclosure is not limited thereto, and the first bank BNK1 may have a side wall having a curved surface or a step shape. For example, the first bank BNK1 may have a cross-section of a semicircle or semi-ellipse shape.

Electrodes and insulation layers disposed at an upper portion of the first bank BNK1 may have a shape corresponding to the first bank BNK1. For example, the first and second electrodes ELT1 and ELT2, and the first and second contact electrodes CNE1 and CNE2 may be disposed on an area of the first bank BNK1, and may include an inclined or curved surface having a shape corresponding to the shape of the first bank BNK1. Similarly, first, third, and/or fourth insulation layers INS1, INS3, and INS4 may be disposed on the first bank BNK1 to include inclined surfaces or curved surfaces having a shape corresponding to the shape of the first bank BNK1.

The first bank BNK1 may contain an insulating material including at least one inorganic material and/or an organic material. For example, the first bank BNK1 may include at least one layer of inorganic film that includes various inorganic insulating materials including a silicon nitride (SiNx), a silicon oxide (SiOx), a silicon oxynitride (SiOxNy), or a combination thereof. In another embodiment, the first bank BNK1 may include at least one layer of organic film and/or photo resist film that include various organic insulating materials, or may include a single-layered or multi-layered insulator complexly including organic/inorganic materials. For example, the material and/or pattern shape of the first bank BNK1 may be variously changed.

In an embodiment, the first bank BNK1 may function as a reflective member. For example, the first bank BNK1, along with the first and second electrodes ELT1 and ELT2 provided thereon, may function as a reflective member that guides the light emitted from each light emitting element LD in a desired direction (for example, an upper direction of the pixel PXL) to improve the light efficiency of the pixel PXL.

The first and second electrodes ELT1 and ELT2 included in the pixel electrodes of each pixel PXL may be disposed at the upper portion of the first bank BNK1. The first electrode ELT1 and the second electrode ELT2 may be disposed in each pixel area PXA (PXA1, PXA2, PXA3) in which each PXL may be provided and/or formed. For example, the first electrode ELT1 and the second electrode ELT2 may be disposed in the light emitting area EMA of each pixel PXL. The first and second electrodes ELT1, and ELT2 may be disposed apart from each other. For example, the first and second electrodes ELT1 and ELT2 may be spaced apart side by side by an interval in each light emitting area EMA.

In some embodiments, the first and/or second electrodes ELT1 and ELT2 may have a pattern separated for each pixel PXL or a pattern that may be commonly connected to multiple pixels PXL. On the other hand, before the process of forming the pixel PXL, particularly before the alignment of the light emitting elements LD may be completed, the first electrodes ELT1 of the pixels PXL disposed in the display area DA may be connected to each other, and the second electrodes ELT2 of the pixels PXL may be connected to each other. For example, before the alignment of the light emitting elements LD may be completed, the first electrodes ELT1 of the pixels PXL may be formed integrally or non-integrally with each other and may be electrically connected to each other, and the second electrodes ELT2 of the pixels PXL may be formed integrally or non-integrally with each other and may be electrically connected to each other. In case that the first electrodes ELT1 or the second electrodes ELT2 of the pixels PXL may be non-integrally connected to each other, the first electrodes ELT1 or the second electrodes ELT2 may be electrically connected to each other by at least one contact hole and/or bridge pattern.

The first and second electrodes ELT1 and ELT2 may receive a first alignment signal (or first alignment voltage) and a second alignment signal (or second alignment voltage), respectively, in an alignment step of the light emitting elements LD. For example, one of the first and second electrodes ELT1 and ELT2 may be supplied with an AC-type alignment signal, and another of the first and second electrodes ELT1 and ELT2 may be supplied with an alignment voltage (for example, a ground voltage) having a constant voltage level. For example, an alignment signal may be applied to the first and second electrodes ELT1 and ELT2 in the alignment step of the light emitting elements LD. Accordingly, an electric field may be formed between the first and second electrodes ELT1 and ELT2. The light emitting elements LD provided in each pixel area (particularly, the light emitting area EMA of each pixel PXL) may be self-aligned between the first and second electrodes ELT1 and ELT2 by the electric field. After the alignment of the light emitting elements LD may be completed, by disconnecting the at least the first electrodes ELT1 between the pixels PXL, the pixels PXL may be formed in a form capable of being individually driven.

The first electrode ELT1 may be electrically connected to a circuit element (for example, at least one transistor configuring the pixel circuit PXC), a power line (for example, the first power line PL1), and/or a signal line (for example, the scan line Si, the data line Dj, or a control line), through a first contact hole CH1. In an embodiment, the first electrode ELT1 may be electrically connected to the bridge pattern BRP through the first contact hole CH1, and thus, it may be electrically connected to the transistor T. However, the disclosure is not limited thereto, and the first electrode ELT1 may be connected (e.g., directly connected) to a power wire or signal wire.

The second electrode ELT2 may be electrically connected to a circuit element (for example, at least one transistor configuring the pixel circuit PXC), a power line (wire) (for example, the second power line (wire) PL2), and/or a signal line (for example, the scan line Si, the data line Dj, or a control line), through a second contact hole CH2. In an embodiment, the second electrode ELT2 may be electrically connected to the second power wire PL2 through the second contact hole CH2. However, the disclosure is not limited thereto, and the second electrode ELT2 may be connected (e.g., directly connected) to a power wire or signal wire.

Each of the first and second electrodes ELT1 and ELT2 may contain at least one conductive material. For example, each of the first and second electrodes ELT1 and ELT2 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), or a combination thereof; a conductive oxide such as an indium tin oxide (ITO), an indium zinc oxide (IZO), an indium tin zinc Oxide (ITZO), a zinc oxide (ZnO), an aluminum zinc oxide (AZO), a gallium zinc oxide (GZO), a zinc tin oxide (ZTO), a gallium tin oxide (GTO), a fluorine tin oxide (FTO), or a combination thereof; and at least one conductive material among conductive polymers such as PEDOT, but are not limited thereto. For example, each of the first and second electrodes ELT1 and ELT2 may contain other conductive materials in addition to a carbon nanotube, graphene, or a combination thereof. Each of the first and second electrodes ELT1 and ELT2 may be configured of a single layer or multilayer. For example, each of the first and second electrodes ELT1 and ELT2 may include a reflective electrode layer containing a reflective conductive material. Each of the first and second electrodes ELT1 and ELT2 may selectively further include at least one of at least one transparent electrode layer disposed at an upper portion and/or a lower portion of the reflective electrode layer and at least one conductive capping layer covering an upper portion of the reflective electrode layer and/or the transparent electrode layer.

The first insulation layer INS1 may be disposed on one area of the first and second electrodes ELT1 and ELT2. For example, the first insulation layer INS1 may be formed to cover an area of each of the first and second electrodes ELT1 and ELT2, and may include an opening exposing another area of each of the first and second electrodes ELT1 and ELT2. For example, the first insulation layer INS1 may include an opening formed on an upper surface of the first bank BNK1. In the area in which the first insulation layer INS1 may be opened, the first and second electrodes ELT1 and ELT2 may be electrically connected to the first and second contact electrodes CNE1 and CNE2, respectively. In some embodiments, the first insulation layer INS1 may be omitted. The light emitting elements LD may be disposed on (e.g., directly disposed on) the passivation layer PSV and/or an end of each of first and second electrodes ELT1 and ELT2.

In an embodiment, the first insulation layer INS1 may be first formed to entirely cover the first and second electrodes ELT1 and ELT2. After the light emitting elements LD may be supplied and arranged on the first insulation layer INS1, the first insulation layer INS1 may be partially opened to expose an area of the first and second electrodes ELT1 and ELT2. For example, the insulation layer INS1 has an opening exposing one area of the first and second electrodes ELT1 and ELT2 on an upper surface of the first bank BNK1, and may at least partially cover the inclined or curved surfaces of the first and second electrodes ELT1 and ELT2. In another embodiment, the first insulation layer INS1 may be patterned in a form of an individual pattern that may be locally disposed only under the light emitting elements LD after the light emitting elements LD may be completely supplied and arranged. The first insulation layer INS1 may be formed to cover the first and second electrodes ELT1 and ELT2 after the first and second electrodes ELT1 and ELT2 may be formed. Accordingly, it may be possible to prevent the first and second electrodes ELT1 and ELT2 from being damaged in a subsequent process.

The first insulation layer INS1 may be formed as a single layer or multilayer, and may include at least one inorganic insulating material and/or organic insulating material. For example, the first insulation layer INS1 may include a silicon nitride (SiNx), a silicon oxide (SiOx), a silicon oxynitride (SiOxNy), an aluminum oxide (AlOx), or a combination thereof and/or various types of organic/inorganic insulating materials.

The light emitting elements LD may be provided and arranged on the first and second electrodes ELT1 and ELT2 and the first insulation layer INS1.

The light emitting elements LD may be supplied to each pixel PXL in which the first bank BNK1, the first and second electrodes ELT1 and ELT2, the first insulation layer INS1, and the like may be formed to be arranged between the first and second electrodes ELT1 and ELT2. For example, light emitting elements LD may be supplied to the light emitting area EMA of each pixel PXL through an inkjet method, a slit coating method, or various other methods, and the light emitting elements LD may be aligned between the first and second electrodes ELT1 and ELT2 with directionality by an alignment signal (or alignment voltage) applied to each of the first and second electrodes ELT1 and ELT2.

In an embodiment, at least some of the light emitting elements LD may be disposed between the pair of first and second electrodes ELT1 and ELT2 so that both end portions thereof (for example, the first and second end portions EP1 and EP2) overlap an adjacent pair of first and second electrodes ELT1 and ELT2. In another embodiment, at least some of the light emitting elements LD may be disposed so as to not overlap the first and/or second electrodes ELT1 and ELT2 between a pair of adjacent first and second electrodes ELT1 and ELT2, and may be electrically connected to the pair of first and second electrodes ELT1 and ELT2 through the first and second contact electrodes CNE1 and CNE2, respectively. Each light emitting element LD electrically connected between the first and second electrodes ELT1 and ELT2 may form an effective light source of the corresponding pixel PXL. The effective light sources may configure the light source part LSU of the corresponding pixel PXL.

The second insulation layer INS2 may be disposed on one area of the light emitting elements LD. For example, the second insulation layer INS2 may be disposed on one area of each of the light emitting elements LD to expose the first and second end portions EP1 and EP2 of each of the light emitting elements LD. For example, the second insulation layer INS2 may be locally disposed at an upper portion of one area including a central area of each of the light emitting elements LD. In case that the second insulation layer INS2 is formed on the light emitting elements LD after the alignment of the light emitting elements LD may be completed, it may be possible to prevent the light emitting elements LD from deviating from an aligned position.

The second insulation layer INS2 may be formed in an independent pattern in the light emitting area EMA of each pixel PXL, but is not limited thereto. In some embodiments, the second insulation layer INS2 may be omitted, and one end of each of the first and second contact electrodes CNE1 and CNE2 may be disposed on (e.g., directly disposed on) the upper surface of the light emitting elements LD.

The second insulation layer INS2 may be formed as a single layer or multilayer, and may include at least one inorganic insulating material and/or organic insulating material. For example, the second insulation layer INS2 may include a silicon nitride (SiNx), a silicon oxide (SiOx), a silicon oxynitride (SiOxNy), an aluminum oxide (AlOx), a photo resist, various types of organic/inorganic insulating materials, or combination thereof.

Both end portions of the light emitting elements LD that may not be covered by the second insulation layer INS2, for example, the first and second end portions EP1 and EP2, may be covered by the first and second contact electrodes CNE1 and CNE2 respectively. The first and second contact electrodes CNE1 and CNE2 may be formed to be spaced apart from each other. For example, the adjacent first and second contact electrodes CNE1 and CNE2 may be spaced apart from each other on the first and second end portions EP1 and EP2 of at least one adjacent light emitting element LD, with the second insulation layer INS2 therebetween.

The first and second contact electrodes CNE1 and CNE2 may be disposed at the upper portion of the first and second electrodes ELT1 and ELT2 to cover the exposed area of each of the first and second electrodes ELT1 and ELT2. For example, the first and second contact electrodes CNE1 and CNE2 may be disposed on at least one area of each of the first and second electrodes ELT1 and ELT2 so as to directly/ indirectly contact with each of the first and second electrodes ELT1 and ELT2 at the upper portion of the first bank BNK1 or around the first bank BNK1. Accordingly, the first and second contact electrodes CNE1 and CNE2 may be electrically connected to the first and second electrodes ELT1 and ELT2, respectively. For example, the first and second electrodes ELT1 and ELT2 may be electrically connected to the first or second end portions EP1 and EP2 of at least one light emitting element LD adjacent thereto through the first and second contact electrodes CNE1 and CNE2, respectively.

In an embodiment, the first and second contact electrodes CNE1 and CNE2 may be sequentially formed in different layers on one surface of the substrate SUB as shown in FIG. 8. The third insulation layer INS3 may be disposed between the first contact electrode CNE1 and the second contact electrode CNE2. The order of formation of the first and second contact electrodes CNE1 and CNE2 may vary according to embodiments. For example, in another embodiment, before the first contact electrode CNE1 may be formed, the second contact electrode CNE2 may be first formed, and the third insulation layer INS3 may be formed to cover the second contact electrode CNE2 and the second insulation layer INS2, and the first contact electrode CNE1 may be formed on the third insulation layer INS3. However, the disclosure is not limited thereto, and the first and second contact electrodes CNE1 and CNE2 may be disposed on the same layer as shown in FIG. 9. For example, the first and second contact electrodes CNE1 and CNE2 may be formed of the same conductive layer on one surface of the substrate SUB. Since the first and second contact electrodes CNE1 and CNE2 may be simultaneously formed in the same process, a manufacturing process of the pixel PXL and the display device including the same may be simplified. However, the disclosure is not limited thereto, and the first and second contact electrodes CNE1 and CNE2 may be sequentially formed.

The first and second contact electrodes CNE1 and CNE2 may be made of various transparent conductive materials. For example, the first and second contact electrodes CNE1 and CNE2 may include at least one of various transparent materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO), and they may be implemented to be substantially transparent or translucent to satisfy a transmittance. Accordingly, the light emitted from the light emitting elements LD through each of the first and second ends EP1 and EP2 may pass through the first and second contact electrodes CNE1 and CNE2 to be emitted to the outside of the display panel PNL.

The third insulation layer INS3 may be disposed between the first contact electrode CNE1 and the second contact electrode CNE2. As such, in case that the third insulation layer INS3 may be formed between the first contact electrode CNE1 and the second contact electrode CNE2, it may be possible to secure electrical stability between the first and second end portions EP1 and EP2 of the light emitting elements LD. For example, the first and second contact electrodes CNE1 and CNE2 may be stably separated by the third insulation layer INS3. Accordingly, it may be possible to effectively prevent a short circuit defect from occurring between the first and second end portions EP1 and EP2 of the light emitting elements LD.

The third insulation layer INS3 may be formed as a single layer or multilayer, and may include at least one inorganic insulating material and/or organic insulating material. For example, the third insulation layer INS3 may include a silicon nitride (SiNx), a silicon oxide (SiOx), a silicon oxynitride (SiOxNy), an aluminum oxide (AlOx), a photo resist, various types of organic/inorganic insulating materials, or a combination thereof.

A fourth insulation layer INS4 may be disposed on the first and second contact electrodes CNE1 and CNE2 and/or the third insulation layer INS3. For example, the fourth insulation layer INS4 may cover the first banks BNK1, the first and second electrodes ELT1 and ELT2, the first, second, and/or third insulation layers INS1, INS2, and/or INS3, and the light emitting elements LD, and the first and second contact electrodes CNE1 and CNE2. The fourth insulation layer INS4 may include at least one layer of an inorganic layer and/or organic layer.

The fourth insulation layer INS4 may be formed as a single layer or multilayer, and may include at least one inorganic insulating material and/or organic insulating material. For example, the fourth insulation layer INS4 may include a silicon nitride (SiNx), a silicon oxide (SiOx), a silicon oxynitride (SiOxNy), an aluminum oxide (AlOx), or a combination thereof, and various types of organic/inorganic insulating materials.

In an embodiment, the fourth insulation layer INS4 may include a thin film encapsulation layer of a multi-layered structure. For example, the fourth insulation layer INS4 may include a thin film encapsulation layer of a multi-layered structure that includes at least two inorganic insulation layers and at least one organic insulation layer interposed between the at least two inorganic insulation layers. However, the disclosure is not limited thereto, and the material and/or structure of the fourth insulation layer INS4 may be variously changed.

A second bank BNK2, the color conversion layer CCL, a capping layer CP, and the color filter layer CFL may be disposed on the display layer DPL.

The second bank BNK2 may be disposed to surround the light emitting area EMA of the pixels PXL. For example, the second bank BNK2 may be disposed in a boundary area of each pixel area PXA in which the pixel PXL may be provided and/or in an area between adjacent pixels PXL. Hereinafter, when referring to an arbitrary pixel area among the first, second, and third pixel areas PXA1, PXA2, and PXA3, or when comprehensively referring to two or more thereof, it will be referred to as "pixel area PXA" or "pixel areas PXA".

The second bank BNK2 may include an opening defining the light emitting area EMA of the pixels PXL. The color conversion layer CCL may be disposed in the opening of the second bank BNK2. Each light emitting area EMA may be partitioned by the second bank BNK2, so that the color conversion layer CCL may be supplied to the light emitting area EMA. For example, in the step of forming the color conversion layer CCL, the second bank BNK2 may function as a dam structure defining each light emitting area EMA to which the color conversion layer CCL may be supplied.

The second bank BNK2 may include at least one light-blocking and/or reflective material to prevent light leakage between adjacent pixels PXL. For example, the second bank BNK2 may include at least one black matrix material (for example, at least one light-blocking material) among various types of black matrix materials, and/or a color filter material of a specific color. For example, the second bank BNK2 may be formed in a black opaque pattern to block light transmission.

The color conversion layer CCL may be disposed on the light emitting elements LD in the opening of the second bank BNK2. The color conversion layer CCL may include a first color conversion layer CCL1 disposed on the first pixel PXL1, a second color conversion layer CCL2 disposed on the second pixel PXL2, and a light scattering layer LSL disposed on the third pixel PXL3.

In an embodiment, the first to third pixels PXL1, PXL2, and PXL3 may include light emitting elements LD that emit light of the same color. For example, the first to third pixels PXL1, PXL2, and PXL3 may include light emitting elements LD that emit blue light in a wavelength band of approximately 400 nm to approximately 500 nm. The color conversion layer CCL including color conversion particles may be disposed on at least some of the pixels PXL among the first to third pixels PXL1, PXL2, and PXL3, thereby displaying a full-color image. However, the disclosure is not limited thereto, the first to third pixels PXL1, PXL2, and PXL3 may include light emitting elements LD that emit light of different colors. For example, the first pixel PXL1 may include a first color (or red color) light emitting element LD, the second pixel PXL2 may include a second color (or green color) light emitting element LD, and the third pixel PXL3 may include a third color (or blue color) light emitting element LD.

The first color conversion layer CCL1 may include first color conversion particles that convert light of the third color emitted from the light emitting element LD into light of the first color. For example, in case that the light emitting element LD is a blue light emitting element that emits blue light and the first pixel PXL1 is a red pixel, the first color conversion layer CCL1 may include a first quantum dot QDr that converts blue light emitted from the blue light emitting element into red light. For example, the first color conversion layer CCL1 may include first quantum dots QDr dispersed in a matrix material such as a base resin. The first quantum dot QDr may absorb blue light and shift a wavelength thereof according to energy transition to emit red light in a wavelength band of approximately 620 nm to approximately 780 nm. In case that the first pixel PXL1 is a pixel of a different color, the first color conversion layer CCL1 may include a first quantum dot corresponding to a color of the first pixel PXL1.

The second color conversion layer CCL2 may include second color conversion particles that convert light of the third color emitted from the light emitting element LD into light of the second color. For example, in case that the light emitting element LD is a blue light emitting element that emits blue light and the second pixel PXL2 is a green pixel, the second color conversion layer CCL2 may include a second quantum dot QDg that converts blue light emitted from the blue light emitting element into green light. For example, the second color conversion layer CCL2 may include second quantum dots QDg dispersed in a matrix material such as a base resin. The second quantum dot QDg may absorb blue light and shift a wavelength thereof according to energy transition to emit green light in a wavelength band of approximately 500 nm to approximately 570 nm. In case that the second pixel PXL2 is a pixel of a different color, the second color conversion layer CCL2 may include a second quantum dot corresponding to a color of the second pixel PXL2.

Each of the first quantum dot QDr and the second quantum dot QDg may be selected from a group II-IV compound, a group IV-VI compound, a group IV element, a group VI compound, and a combination thereof, but is not limited thereto.

The first quantum dot QDr and the second quantum dot QDg may have a full width of half maximum (FWHM) of a light emitting wavelength spectrum of approximately 45 nm or less, and light emitted through the first quantum dot QDr and the second quantum dot QDg may be emitted in a front direction. Accordingly, a viewing angle of the display device may be improved.

The first quantum dot QDr and the second quantum dot QDg may have a spherical, pyramidal, and multi-arm shape, or a cube of a nano particle, a nanotube, a nano wire, a nano fiber, a nano plate-shaped particle, etc., but are not limited thereto, and shapes of the first quantum dot QDr and the second quantum dot QDg may be variously changed.

In an embodiment, blue light having a relatively short wavelength among the visible ray bands may be incident on the first quantum dot QDr and the second quantum dot QDg, respectively, thereby increasing an absorption coefficient of the first quantum dot QDr and the second quantum dot QDg. Accordingly, the efficiency of light emitted from the first pixel PXL1 and the second pixel PXL2 may be finally increased, and excellent color reproducibility may be secured. The light source part LSU of the first, second, and third pixels PXL1, PXL2, and PXL3 may be configured by using the light emitting elements LD of the same color (for example, the blue color light emitting elements LD), thereby increasing the manufacturing efficiency of the display device.

The light scattering layer LSL may be selectively provided to efficiently use the third color light emitted from the light emitting element LD. For example, in case that the light emitting element LD is a blue light emitting element that emits blue light and the third pixel PXL3 is a blue pixel, the light scattering layer LSL may include at least one type of light scattering particles SCT to efficiently use the light emitted from the light emitting element LD.

For example, the light scattering layer LSL may include light scattering particles SCT dispersed in a matrix material such as a base resin. For example, the light scattering layer LSL may include the light scattering particles SCT such as a titanium dioxide TiO2, silica, or a combination thereof, but materials included in the light scattering particles SCT are not limited thereto. On the other hand, the light scattering particles SCT need not be disposed only in the third pixel PXL in which the third pixel PXL3 may be formed. For example, the light scattering particles SCT may be selectively included in the first and/or second color conversion layers CCL1 and CCL2.

The capping layer CP may be disposed on the color conversion layer CCL. The capping layer CP may cover (e.g., directly cover) the color conversion layer CCL. A surface of the capping layer CP may contact the color conversion layer CCL, and another surface of the capping layer CP may contact the color filter layer CFL, which will be described later. The capping layer CP may be entirely disposed on the first to third pixels PXL1, PXL2, and PXL3. The capping layer CP may prevent impurities such as moisture or air from penetrating from the outside to damage or contaminate the color conversion layer CCL. The capping layer CP may be an inorganic layer, which may include silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or a combination thereof.

The color filter layer CFL may be disposed on the capping layer CP. The color filter layer CFL may be disposed on (e.g., directly disposed on) the capping layer CP. The color filter layer CFL may include a color filter that matches the color of each pixel PXL. For example, the color filter layer CFL may include a first color filter CF1 that may be disposed in the first pixel PXL1 to selectively transmit light generated by the first pixel PXL1, a second color filter CF2 that may be disposed in the second pixel PXL2 to selectively transmit light generated by the second pixel PXL2, and a third color filter CF3 that may be disposed in the third pixel PXL3 to selectively transmit light generated by the third pixel PXL3. In an embodiment, the first color filter CF1, the second color filter CF2, and the third color filter CF3 may be a red color filter, a green color filter, and a blue color filter respectively, but the disclosure is not limited thereto. Hereinafter, when referring to one of the first color filter CF1, the second color filter CF2, and the third color filter CF3, or when comprehensively referring to two or more thereof, it will be referred to as the "color filter CF" or "color filters CF".

The first color filter CF1 may be disposed to overlap the light emitting area EMA of the first pixel PXL1, and may include a color filter material that selectively transmits light of the first color. For example, in case that the first pixel PXL1 is a red pixel, the first color filter CF1 may include a red color filter material.

The second color filter CF2 may be disposed to overlap the light emitting area EMA of the second pixel PXL2, and may include a color filter material that selectively transmits light of the second color. For example, in case that the second pixel PXL2 is a green pixel, the second color filter CF2 may include a green color filter material.

The third color filter CF3 may be disposed to overlap the light emitting area EMA of the third pixel PXL3, and may include a color filter material that selectively transmits light of the third color. For example, in case that the third pixel PXL3 is a blue pixel, the third color filter CF3 may include a blue color filter material.

A light blocking pattern BM may be disposed between the color filters CF. The light blocking pattern BM may be disposed in boundary areas of the pixels PXL so as to not overlap each light emitting area EMA. For example, the light blocking pattern BM may be disposed to overlap the second bank BNK2. The light blocking pattern BM may include at least one black matrix material (for example, at least one light-blocking material) among various types of black matrix materials, and/or a color filter material of a specific color. The light blocking pattern BM and the second bank BNK2 may be made of a same material, but is not limited thereto. For example, the light blocking pattern BM and the second bank BNK2 may include the same material, or different materials. The light blocking pattern BM may be omitted according to embodiments. The first to third color filters CF1, CF2, and CF3 may be disposed to overlap each other at the boundaries of the pixels PXL.

In an embodiment, the color filter layer CFL may serve to improve light efficiency of the display panel PNL through recycling by totally reflecting light provided from the color conversion layer CCL. To this end, the color filter layer CFL may have a relatively low refractive index compared to the color conversion layer CCL. For example, a refractive index of the color filter layer CFL may be in a range of about 1.2 to about 1.6, but is not limited thereto.

In order to implement the low refractive index color filter layer CFL, the color filter layer CFL may include a low refractive material LR. The low refractive material LR may include hollow particles. The hollow particle may include at least one of hollow silica, hollow acryl, hollow vinyl, hollow epoxy, hollow urethane, and hollow styrene, but the disclosure is not limited thereto. In an embodiment, a content of the hollow particles may be about 50 wt % or less based on about 100 wt % of a solid content of the color filter layer CFL. However, configurations are not limited thereto, and may be variously adjusted within a range that minimizes decrease in luminance of the color filter layer CFL. As described above, in case that the display panel PNL includes the low refractive color filter layer CFL, since a separate low refractive layer disposed on the color conversion layer CCL may be omitted, it is possible to improve the light efficiency of the display panel PNL and to simplify a manufacturing process.

In an embodiment, a refractive index and thickness of the color filter layer CFL may be adjusted according to a wavelength of light emitted from the color conversion layer CCL. For example, the first to third color filters CF1, CF2, and CF3 may have different refractive indexes and thicknesses (e.g. $TH\_CF1 \neq TH\_CF2 \neq TH\_CF3$). For example, in case that the first to third pixels PXL1, PXL2, and PXL3 are red, green, and blue pixels, respectively, and in case that the first to third pixels PXL1, PXL2, and PXL3 include the blue light emitting elements LD that emit blue light, the refractive index of the third color filter CF3 may be smaller than that of the first color filter CF1 or of the second color filter CF2 in order to minimize difference in luminance and color quality of the first to third pixels PXL1, PXL2, and PXL3. The thickness $TH\_CF3$ of the third color filter CF3 may be thicker than the thickness $TH\_CF1$ of the first color filter CF1 (i.e., $TH\_CF3 > TH\_CF1$) or the thickness $TH\_CF2$ of the second color filter CF2 (i.e. $TH\_CF3 > TG\_CF2$). However, the disclosure is not limited thereto, and the refractive index and thickness of each of the first to third color filters CF1, CF2, and CF3 may be variously adjusted according to the colors implemented by the first to third pixels PXL1, PXL2, and PXL3, and the wavelength of light emitted by the light emitting element LD disposed in each of the pixels PXL. Hereinafter, a reflectance according to the refractive index and thickness of the color filter layer CFL will be described with reference to FIG. 10 to FIG. 13.

Figure 10:
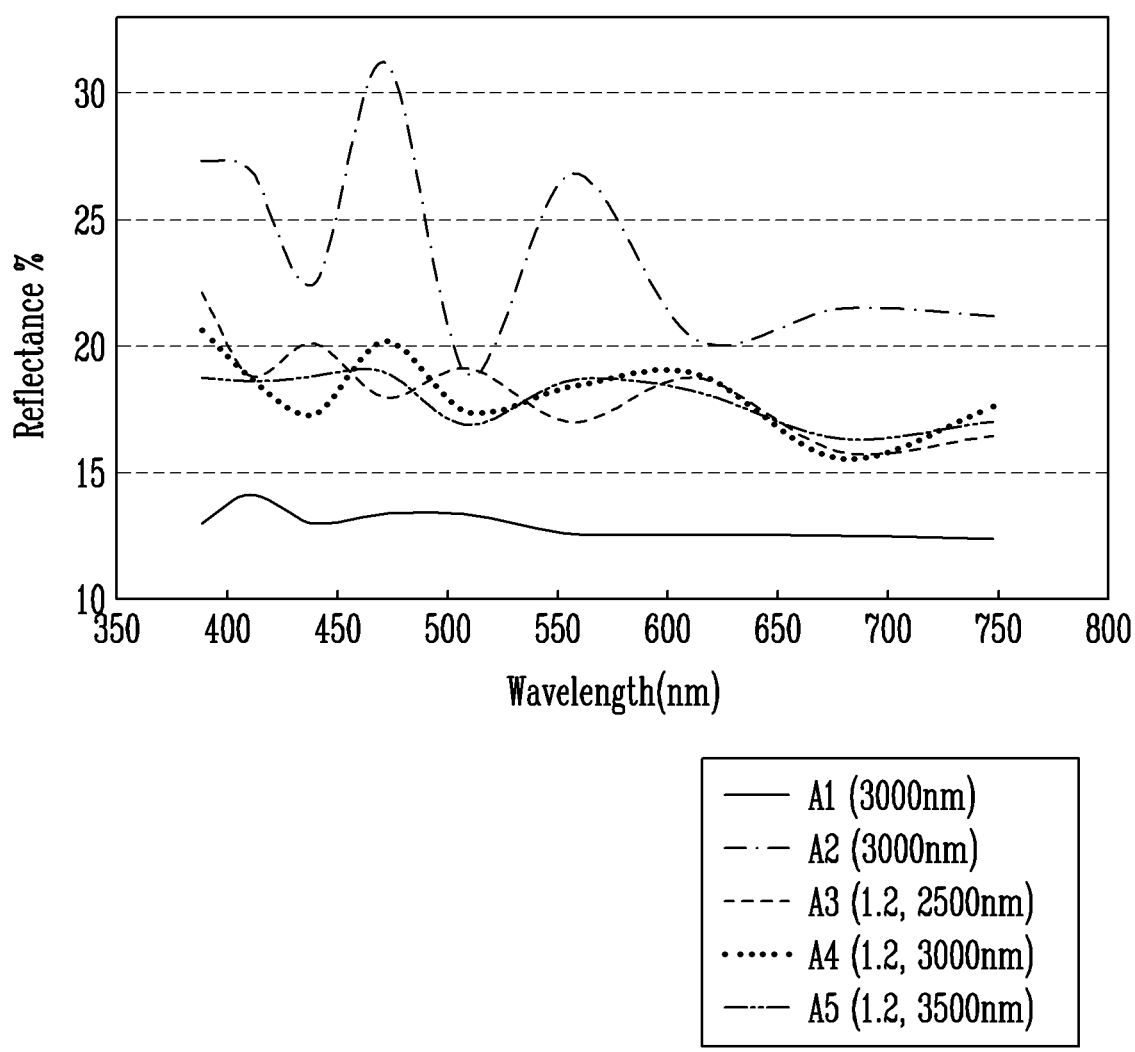
FIG. 10 to FIG. 13 illustrate schematic graphs of reflectance according to a refractive index and thickness of a color filter layer.

Referring to FIG. 10, Example A1 is a case in which the thickness of the color filter layer CFL may be about 3000 nm, and the color filter layer CFL includes no low refractive material LR. Example A2 is a case in which the thickness of the color filter layer CFL may be about 3000 nm, and the color filter layer CFL includes no low refractive material LR, but a separate low refractive index layer may be disposed between the color conversion layer CCL and the color filter layer CFL. Example A3 is a case in which the refractive index of the color filter layer CFL may be about 1.2 and the thickness thereof may be about 2500 nm. Example A4 is a case in which the refractive index of the color filter layer CFL may be about 1.2 and the thickness thereof may be about 3000 nm. Example A5 is a case in which the refractive index of the color filter layer CFL may be about 1.2 and the thickness thereof may be about 3500 nm.

Figure 11:
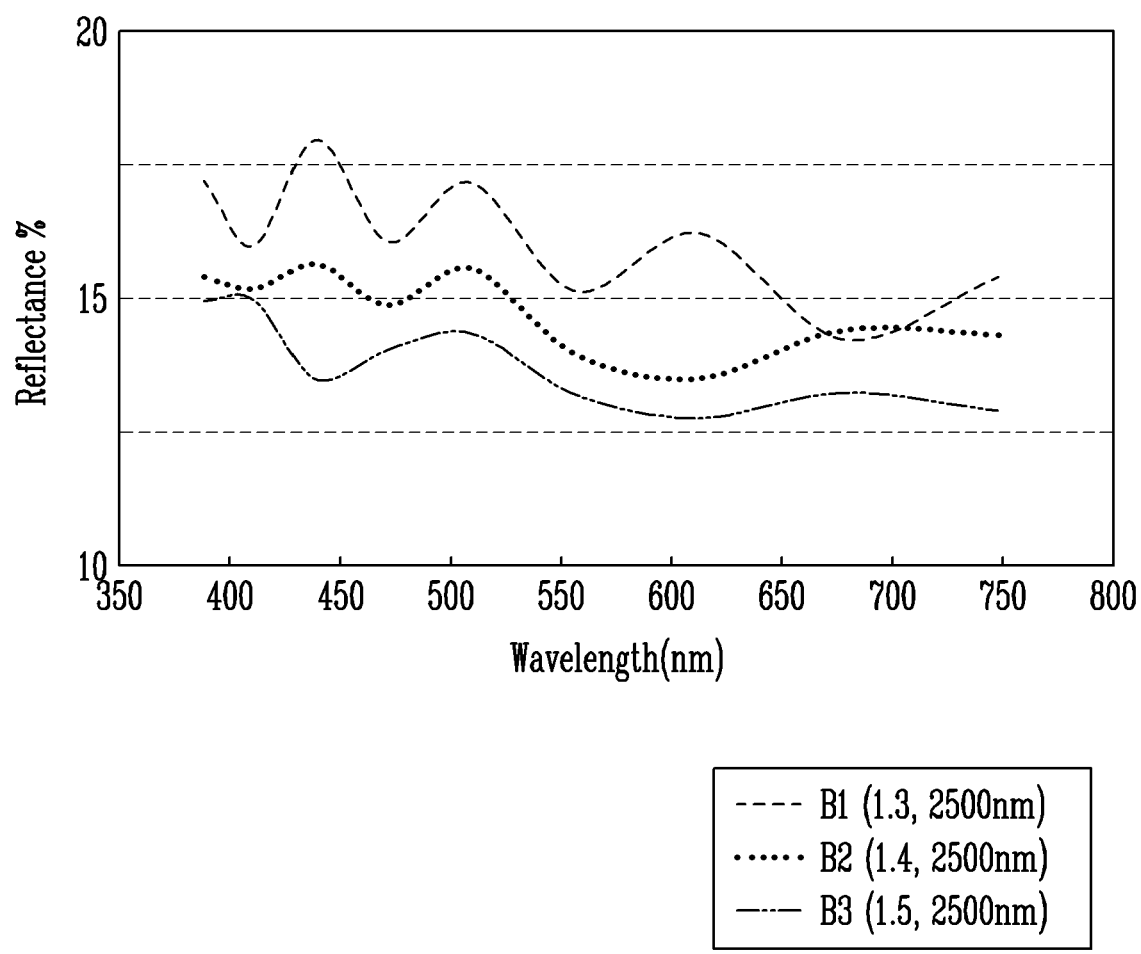

Referring to FIG. 11, Example B1 is a case in which the refractive index of the color filter layer CFL may be about 1.3 and the thickness thereof may be about 2500 nm. Example B2 is a case in which the refractive index of the color filter layer CFL may be about 1.4 and the thickness thereof may be about 2500 nm. Example B3 is a case in which the refractive index of the color filter layer CFL may be about 1.5 and the thickness thereof may be about 2500 nm.

Figure 12:
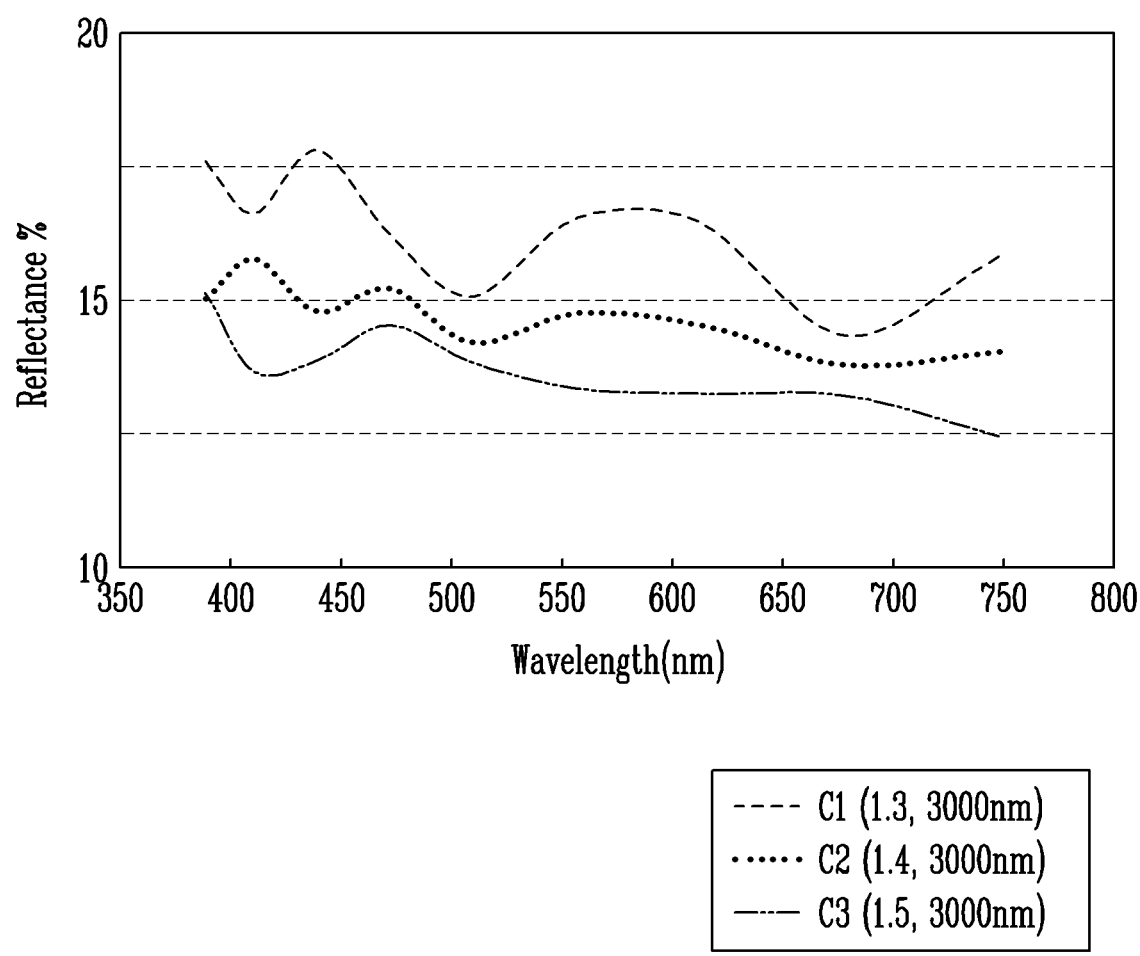

Referring to FIG. 12, Example C1 is a case in which the refractive index of the color filter layer CFL may be about 1.3 and the thickness thereof may be about 3000 nm. Example C2 is a case in which the refractive index of the color filter layer CFL may be about 1.4 and the thickness thereof may be about 3000 nm. Example C3 is a case in which the refractive index of the color filter layer CFL may be about 1.5 and the thickness thereof may be about 3000 nm.

Figure 13:
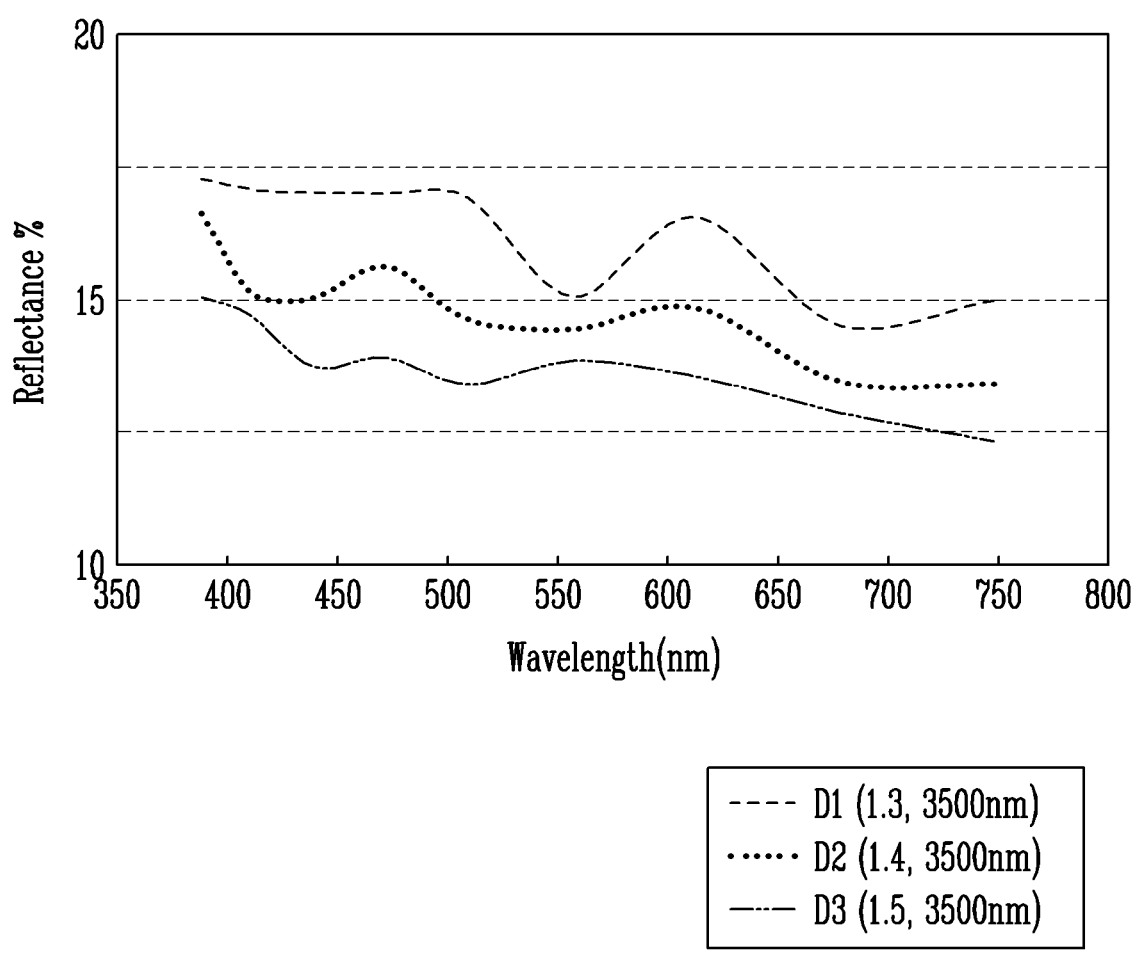

Referring to FIG. 13, Example D1 is a case in which the refractive index of the color filter layer CFL may be about 1.3 and the thickness thereof may be about 3500 nm. Example D2 is a case in which the refractive index of the color filter layer CFL may be about 1.4 and the thickness thereof may be about 3500 nm. Example D3 is a case in which the refractive index of the color filter layer CFL may be about 1.5 and the thickness thereof may be about 3500 nm.

Referring to FIG. 10 to FIG. 13, it can be seen that Example A1 in which the color filter layer CFL includes no low refractive material LR and/or no low refractive layer has a reflectance of about 15% or less with respect to all of about 455 nm of blue light, about 555 nm of green light, and about 655 nm of red light. It can be seen that Example A2 including a separate low refractive layer has a reflectance of about 20% to about 25% with respect to blue light, a reflectance of about 25% or more with respect to green light, and a reflectance of about 20% with respect to red light. For example, in case that a low refractive index layer having a refractive index may be disposed on an entire surface of the pixels PXL in a thickness, a difference in luminance and color quality emitted from the pixels PXL due to a difference in reflectance depending on the wavelength of the recycled light may occur. In Examples A3 to A5, B1 to B3, C1 to C3, and D1 to D3, a reflectance of about 15% to 20% with respect to blue light, green light, and red light may be secured by adding a low refractive material LR to the color filter layer CFL. It may be possible to decrease the reflectance for a specific wavelength band of light by adjusting the refractive index and thickness of the color filter layer CFL, and it may be possible to improve the luminance and color quality of each pixel PXL emitting specific light by increasing the reflectance for the remaining wavelength bands.

Referring back to FIG. 7, an encapsulation layer ENC may be disposed on the color filter layer CFL. The encapsulation layer ENC may cover the color filter layer CFL, the color conversion layer CCL, the display layer DPL, and the circuit layer PCL that may be disposed thereunder. The encapsulation layer ENC may prevent moisture or air from penetrating into the above-mentioned lower members that may be disposed thereunder. To this end, the encapsulation layer ENC may include at least one inorganic layer. For example, the inorganic layer may include silicon nitride (SiNx), aluminum nitride (AlNx), titanium nitride (TiNx), silicon oxide (SiOx), aluminum oxide (AlOx), titanium oxide (TiOx), silicon oxynitride (SiOxNy), or a combination thereof, but the disclosure is not limited thereto. The encapsulation layer ENC may protect the above-mentioned lower members from foreign matters such as dust. To this end, the encapsulation layer ENC may include at least one organic layer. For example, the organic layer may be an acryl resin, an epoxy resin, a phenolic resin, a polyamide resin, a polyimide resin, or a combination thereof, but is not limited thereto. As described above, in case that the encapsulation layer ENC may be disposed on the color filter layer CFL, since a separate upper substrate may be omitted, the thickness of the display panel PNL may be minimized to improve light efficiency.

According to the display device of an embodiment described above, since the color filter layer CFL including the low refractive material LR may be disposed on the color conversion layer CCL to omit a separate low refractive layer, the manufacturing process may be simplified. By adjusting the refractive index and thickness of the first to third color filters CF1, CF2, and CF3 according to the wavelength of light emitted by each pixel PXL, the reflectance may be optimized to improve the luminance and color quality of each pixel PXL.

Hereinafter, another embodiment will be described. The same elements as those described above will refer to the same reference numerals in embodiments below, and redundant descriptions will be omitted or simplified.

Figure 14:
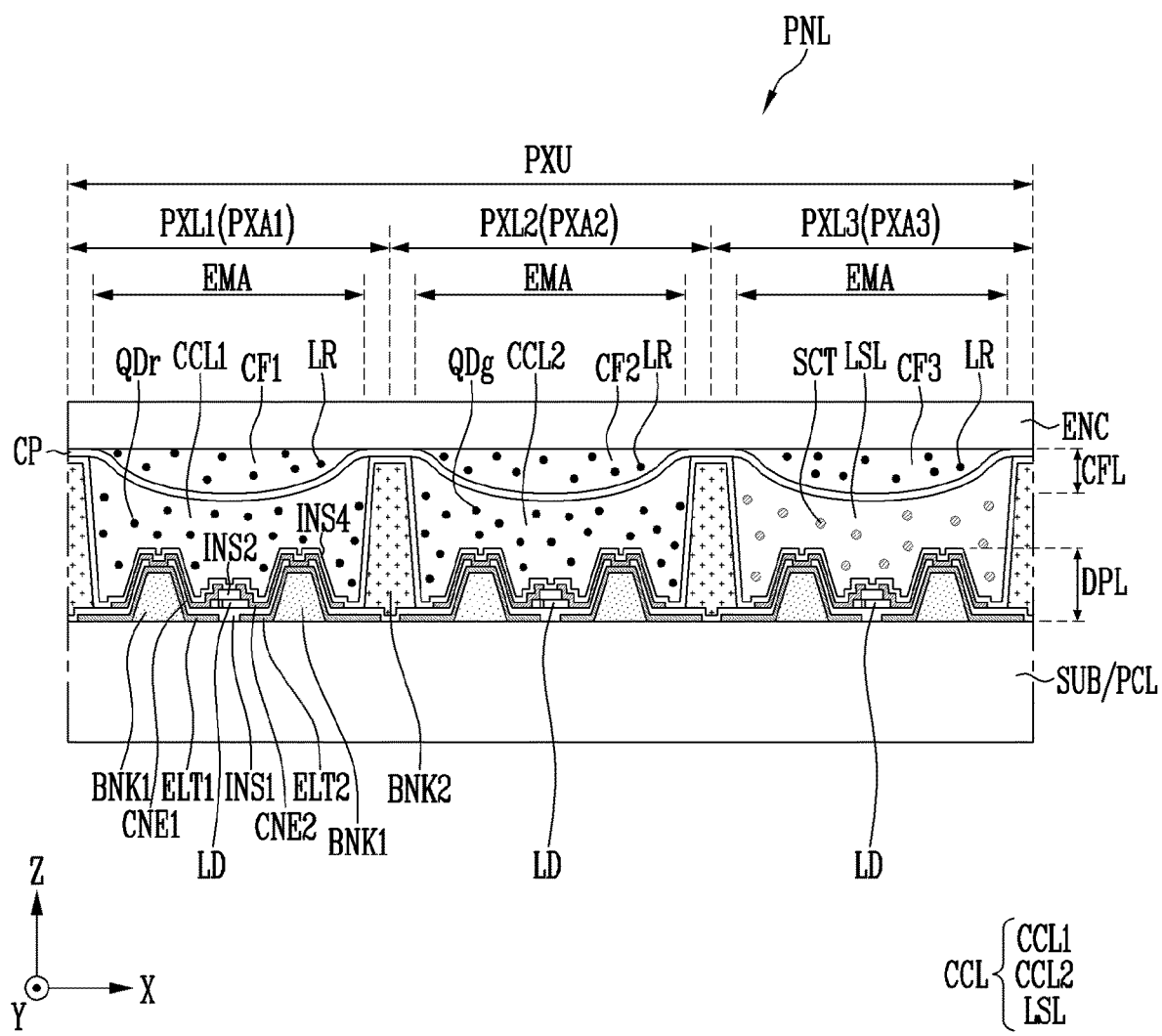
FIG. 14 illustrates a schematic cross-sectional view of a display device according to another embodiment.

FIG. 14 illustrates a schematic cross-sectional view of a display device according to another embodiment.

Referring to FIG. 14, the display device according to an embodiment differs from embodiments of FIG. 1 to FIG. 13 in that the color filter layer CFL may be disposed in an opening of the second bank BNK2.

Specifically, the light emitting area EMA of the pixels PXL may be partitioned by the opening of the second bank BNK2, so that the color filter layer CFL may be formed in each light emitting area EMA. For example, the first color filter CF1 may be disposed in the light emitting area EMA of the first pixel PXL1, the second color filter CF2 may be disposed in the light emitting area EMA of the second pixel PXL2, and the third color filter CF3 may be disposed in the light emitting area EMA of the third pixel PXL3. As such, in case that the color filter layers CFL are respectively disposed in the opening of the second bank BNK2, a separate light blocking pattern may be omitted. However, the disclosure is not limited thereto, and in some embodiments, the light blocking pattern may be partially disposed at the boundaries of the first to third color filters CF1, CF2, and CF3.

In some embodiments, the color filter layer CFL may be disposed on the color conversion layer CCL within the opening of the second bank BNK2. For example, the first color filter CF1 may be disposed on the first color conversion layer CCL1 within the opening of the second bank BNK2, the second color filter CF2 may be disposed on the second color conversion layer CCL2 within the opening of the second bank BNK2, and the third color filter CF3 may be disposed on the light scattering layer LSL within the opening of the second bank BNK2. In the process of forming the color conversion layer CCL, since the color conversion layer CCL may be formed lower than the second bank BNK2, although a step may be formed between the color conversion layer CCL and the second bank BNK2, the color filter layer CFL may be disposed in the opening of the second bank BNK2, so that the step due to the color conversion layer CCL may be minimized. Accordingly, since a separate planarization layer for improving the step due to the color conversion layer CCL may be omitted, light efficiency may be improved by minimizing the thickness of the display panel PNL.

The capping layer CP may be disposed between the color filter layer CFL and the color conversion layer CCL. The capping layer CP may cover (e.g., directly cover) the color conversion layer CCL. A surface of the capping layer CP may contact the color filter layer CFL, and another surface of the capping layer CP may contact the color conversion layer CCL. The capping layer CP may be entirely disposed on the first to third pixels PXL1, PXL2, and PXL3. The capping layer CP may prevent impurities such as moisture or air from penetrating from the outside to damage or contaminate the color conversion layer CCL.

Since the color filter layer CFL, the capping layer CP, and the color conversion layer CCL have been described with reference to FIG. 7, redundant contents are omitted.

Figure 15:
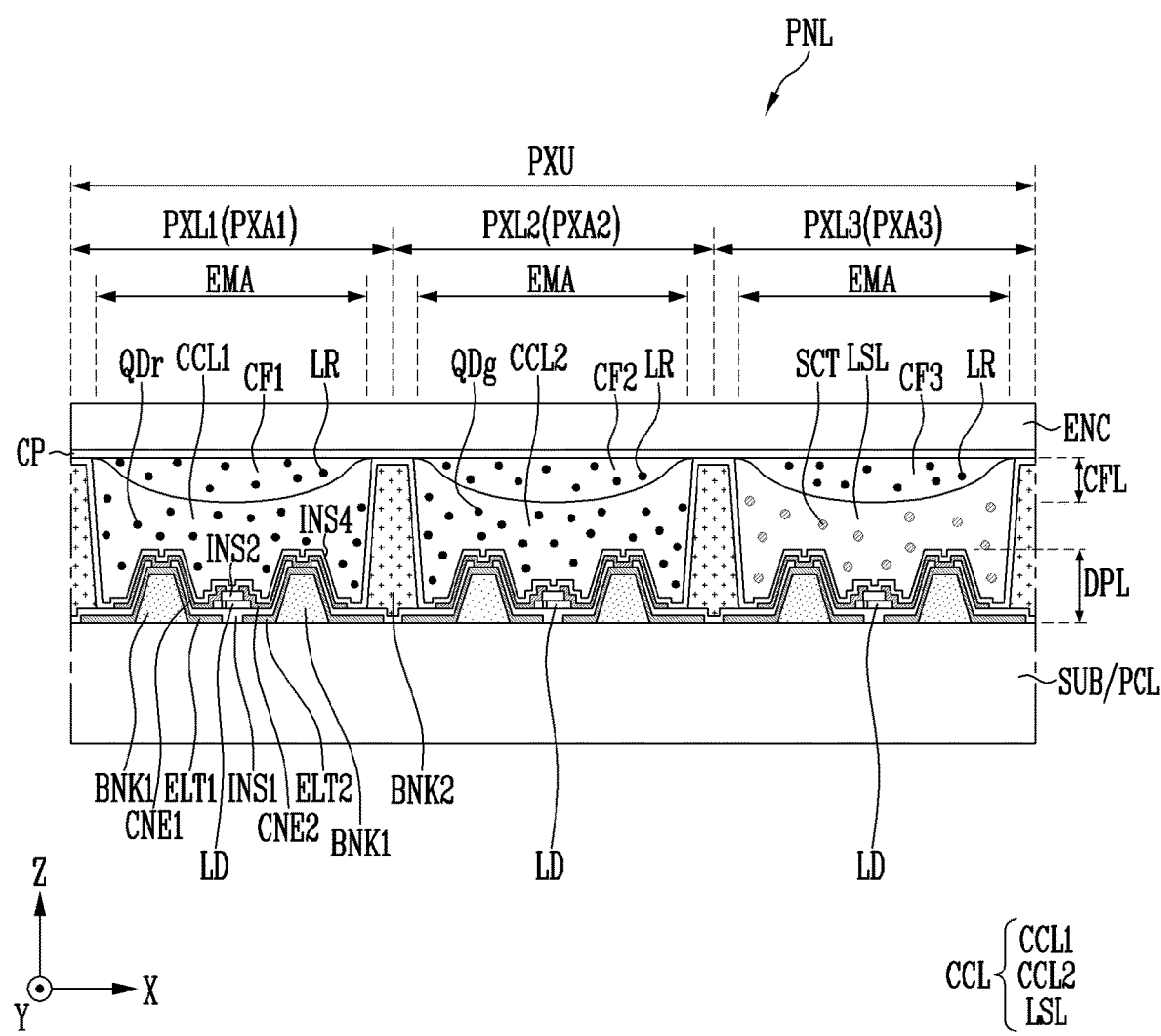
FIG. 15 illustrates a schematic cross-sectional view of a display device according to another embodiment.

FIG. 15 illustrates a schematic cross-sectional view of a display device according to another embodiment.

Referring to FIG. 15, the display device according to an embodiment may differ from an embodiment of FIG. 14 in that the color filter layer CFL may be disposed on (e.g., directly disposed on) the color conversion layer CCL.

Specifically, the color filter layer CFL may be disposed on (e.g., directly disposed on) the color conversion layer CCL to contact the color conversion layer CCL. The color filter layer CFL may serve to prevent impurities such as moisture or air from penetrating into the color conversion layer CCL to damage or contaminate the color conversion layer CCL. As such, in case that the color conversion layer CCL is sealed by the color filter layer CFL, since a process for forming a separate capping layer between the color filter layer CFL and the color conversion layer CCL may be omitted, it may be possible to secure process economic feasibility.

The capping layer CP may be disposed on the color filter layer CFL and the color conversion layer CCL. The capping layer CP may cover (e.g., directly cover) the color filter layer CFL and the color conversion layer CCL. A surface of the capping layer CP may contact the color filter layer CFL, and another surface of the capping layer CP may contact the encapsulation layer ENC. The capping layer CP may be entirely disposed on the first to third pixels PXL1, PXL2, and PXL3. The capping layer CP may prevent impurities such as moisture or air from penetrating from the outside to damage or contaminate the color filter layer CFL and the color conversion layer CCL.

Since the color filter layer CFL, the capping layer CP, and the color conversion layer CCL have been described with reference to FIG. 7, redundant contents are omitted.

Figure 16:
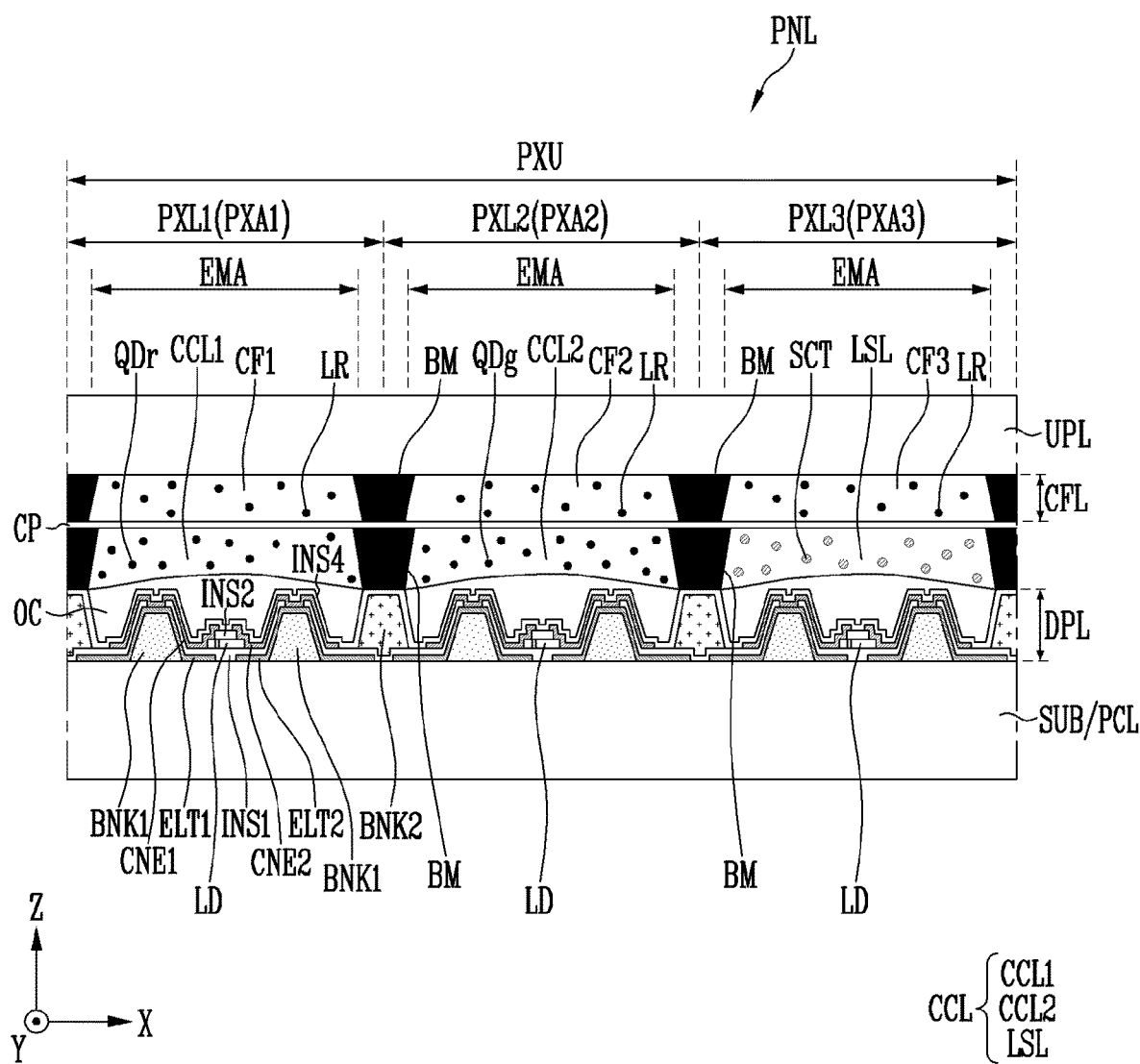
FIG. 16 illustrates a schematic cross-sectional view of a display device according to another embodiment.

FIG. 16 illustrates a schematic cross-sectional view of a display device according to another embodiment.

Referring to FIG. 16, the display device according to an embodiment differs from embodiments of FIG. 1 to FIG. 15 in that an upper substrate UPL may be disposed on the substrate SUB in which the pixel part PXU may be disposed.

Specifically, the upper substrate UPL (also referred to as an "encapsulation substrate" or "color filter substrate") encapsulating the first to third pixels PXL1, PXL2, and PXL3 may be disposed on one surface of the substrate SUB. The upper substrate UPL may include the color filter layer CFL, the capping layer CP, and the color conversion layer CCL that overlap the first to third pixels PXL1, PXL2, and PXL3. In an embodiment, a space between a lower panel of the display panel PNL including the substrate SUB and the display layer DPL and an upper panel of the display panel PNL including the upper substrate UPL, the color filter layer CFL, and the color conversion layer CCL may be filled with an air layer or an overcoat layer OC having a relatively low refractive index in a range of approximately 1 to 1.6.

The color filter layer CFL, the capping layer CP, and the color conversion layer CCL may be disposed on one surface of the upper substrate UPL. For example, the color filter layer CFL may be formed on the upper substrate UPL, the capping layer CP may be formed on the color filter layer CFL, and the color conversion layer CCL may be formed on the color filter layer CFL and the capping layer CP. However, the disclosure is not limited thereto, and the order of formation of the color filter layer CFL, the capping layer CP, and the color conversion layer CCL and/or the shapes thereof may be variously changed. In some embodiments, the light blocking pattern BM may be disposed between the first to third color filters CF1, CF2, and CF3. The light blocking pattern BM may be disposed at the boundaries of the pixel areas PXA so as to not cover each light emitting area EMA. For example, the light blocking pattern BM may be disposed to overlap the second bank BNK2.

In some embodiments, the light blocking pattern BM may be further disposed between the first color conversion layer CCL1, the second color conversion layer CCL2, and the light scattering layer LSL. FIG. 16 illustrates that the light blocking pattern BM may be disposed on the capping layer CP, and the first color conversion layer CCL1, the second color conversion layer CCL2, and the light scattering layer LSL may be respectively formed in the areas partitioned by the light blocking pattern BM, but the disclosure is not limited thereto. For example, in case that it is not necessary to first form the light blocking pattern BM according to the process method and/or the performance of the printing equipment, the first color conversion layer CCL1, the second color conversion layer CCL2, and the light scattering layer LSL may be first used, and the light blocking pattern BM may be formed. For example, the order of formation of the color conversion layer CCL and/or the position or shape according thereto may be variously changed according to embodiments.

Since the color filter layer CFL, the capping layer CP, and the color conversion layer CCL have been described with reference to FIG. 7, redundant contents are omitted.

Those skilled in the art related to the disclosure will readily appreciate that many modifications are possible without materially departing from the novel teachings and advantages. The embodiments should be considered in a descriptive sense only and not for purposes of limitation.

What is claimed is:

1. A display device comprising:
a bank including an opening defining pixels;
a display layer comprising light emitting elements disposed in the pixels;
a color conversion layer disposed on the light emitting elements and disposed in the opening and directly contacting the display layer;
a capping layer overlapping the color conversion layer and overlapping a top surface of the bank in a thickness direction; and
a color filter layer disposed on the capping layer,
wherein the color filter layer includes a hollow particle;
wherein the display layer further comprises:
a second bank disposed on one of a circuit layer or a substrate, the second bank comprising a second opening with one of the light emitting elements disposed therein; and
a reflective layer overlapping the second bank;
wherein
the bank has a first height in the thickness direction; and
the second bank has a second height that is less than the first height in the thickness direction.

2. The display device of claim 1, wherein a refractive index of the color filter layer is in a range of about 1.2 to about 1.6.

3. The display device of claim 1, wherein the color conversion layer includes a base resin, and quantum dots dispersed in the base resin.

4. The display device of claim 1, wherein each of the light emitting elements includes:
a first semiconductor layer;
a second semiconductor layer disposed on the first semiconductor layer; and
an active layer disposed between the first semiconductor layer and the second semiconductor layer.

5. The display device of claim 1, wherein the second opening of the second bank is disposed in the opening of the bank.

6. The display device of claim 1, wherein the reflective layer is an electrode.

7. The display device of claim 1, further comprising a light blocking pattern overlapping the bank, wherein:
the insulating layer directly contacts the top planar surface of the bank;
the light blocking pattern is spaced apart from the insulating layer by the capping layer directly contacting the light blocking pattern and the insulating layer.

8. The display device of claim 1, wherein the hollow particle includes at least one of hollow silica, hollow acryl, hollow vinyl, and hollow epoxy.

9. The display device of claim 8, wherein a content of the hollow particle is about 50 wt % or less of a solid content of the color filter layer.

10. The display device of claim 1, wherein
a surface of the capping layer contacts the color conversion layer, and
another surface of the capping layer contacts the color filter layer.

11. The display device of claim 10, wherein the capping layer includes at least one of a silicon oxide (SiOx), a silicon nitride (SiNx), a silicon oxynitride (SiOxNy), an aluminum oxide (AlOx), and a titanium oxide (TiOx).

12. The display device of claim 1, wherein
the pixels include a first pixel, a second pixel, and a third pixel;
the color conversion layer includes:
a first color conversion layer disposed in the first pixel;
a second color conversion layer disposed in the second pixel; and
a light scattering layer disposed in the third pixel; and
the color filter layer includes:
a first color filter disposed on the first color conversion layer;
a second color filter disposed on the second color conversion layer; and
a third color filter disposed on the light scattering layer.

13. The display device of claim 12, wherein the first color filter, the second color filter, and the third color filter have different refractive indexes.

14. The display device of claim 13, wherein a refractive index of the third color filter is less than a refractive index of the first color filter or a refractive index of the second color filter.

15. The display device of claim 12, further comprising:
a light blocking pattern disposed at a boundary of the first color filter, the second color filter, or the third color filter.

16. The display device of claim 15, wherein the light blocking pattern overlaps the bank.

* * * * *